United States Patent
Wakayama et al.

(10) Patent No.: US 7,323,214 B2
(45) Date of Patent: Jan. 29, 2008

(54) COMPOSITE MAGNETIC MATERIAL ELECTROMAGNETIC WAVE ABSORBING SHEET METHOD FOR MANUFACTURING SHEET-LIKE PRODUCT AND METHOD FOR MANUFACTURING ELECTROMAGNETIC WAVE ABSORBING SHEET

(75) Inventors: Katsuhiko Wakayama, Tokyo (JP); Masahiro Karatsu, Tokyo (JP); Tsutomu Chou, Tokyo (JP); Yasuo Hashimoto, Tokyo (JP)

(73) Assignee: TDK Corporation, Tokyo (JP)

( * ) Notice: Subject to any disclaimer, the term of this patent is extended or adjusted under 35 U.S.C. 154(b) by 418 days.

(21) Appl. No.: 10/494,738

(22) PCT Filed: Nov. 8, 2002

(86) PCT No.: PCT/JP02/11650

§ 371 (c)(1),
(2), (4) Date: Sep. 16, 2004

(87) PCT Pub. No.: WO03/041474

PCT Pub. Date: May 15, 2003

(65) Prior Publication Data

US 2005/0012652 A1 Jan. 20, 2005

(30) Foreign Application Priority Data

Nov. 9, 2001 (JP) .............................. 2001-345308
Jun. 28, 2002 (JP) .............................. 2002-191516

(51) Int. Cl.
*B05D 5/12* (2006.01)
(52) U.S. Cl. ...................... 427/127; 427/128; 427/130; 427/131
(58) Field of Classification Search ................ 427/127, 427/128, 130, 131; 342/1–3
See application file for complete search history.

(56) References Cited

FOREIGN PATENT DOCUMENTS

| CN | 1294746 | 5/2001 |
|---|---|---|
| JP | 06-132692 | 5/1994 |
| JP | 06-252586 | 9/1994 |
| JP | 07-326508 | 12/1995 |
| JP | 09-027693 | 1/1997 |
| JP | 10-056292 | 2/1998 |
| JP | 10-079302 | 3/1998 |
| JP | 10-092623 | 4/1998 |
| JP | 11-040981 | 2/1999 |
| JP | 11-045804 | 2/1999 |

(Continued)

*Primary Examiner*—Alain L. Bashore
(74) *Attorney, Agent, or Firm*—Hogan & Hartson LLP

(57) ABSTRACT

The object of the present invention is to provide an electromagnetic wave absorbing sheet excellent in permeability in high frequencies and to provide a method for manufacturing the same.

The electromagnetic wave absorbing sheet of the present invention comprises insulating layers on the both sides of a magnetic layer. The magnetic layer is formed by densely depositing a large amount of magnetic powder such that the powder undergoes plastic deformation. Each magnetic powder is made to be a composite magnetic material formed of the soft magnetic metal phase consisting of a flaky soft magnetic metal powder and the insulating phase consisting of an insulating film formed on the surface of the soft magnetic metal phase.

Additionally, another configuration can be taken in which a conductive layer is arranged on one of the insulating layers arranged on both sides of the magnetic layer, and the conductive layer is covered with an insulating layer.

7 Claims, 17 Drawing Sheets

FOREIGN PATENT DOCUMENTS

| | | |
|---|---|---|
| JP | 11-074140 | 3/1999 |
| JP | 11-176680 | 7/1999 |
| JP | 2000-004097 | 1/2000 |
| JP | 2000-068117 | 3/2000 |
| JP | 2000-243615 | 9/2000 |
| JP | 2000-332484 | 11/2000 |
| JP | 2001-237591 | 8/2001 |
| JP | 2001-244684 | 9/2001 |
| JP | 2001-308584 | 11/2001 |
| JP | 2002-164689 | 6/2002 |
| JP | 2002-198684 | 7/2002 |
| WO | 00/48211 | 8/2000 |

FIG. 1
(a)
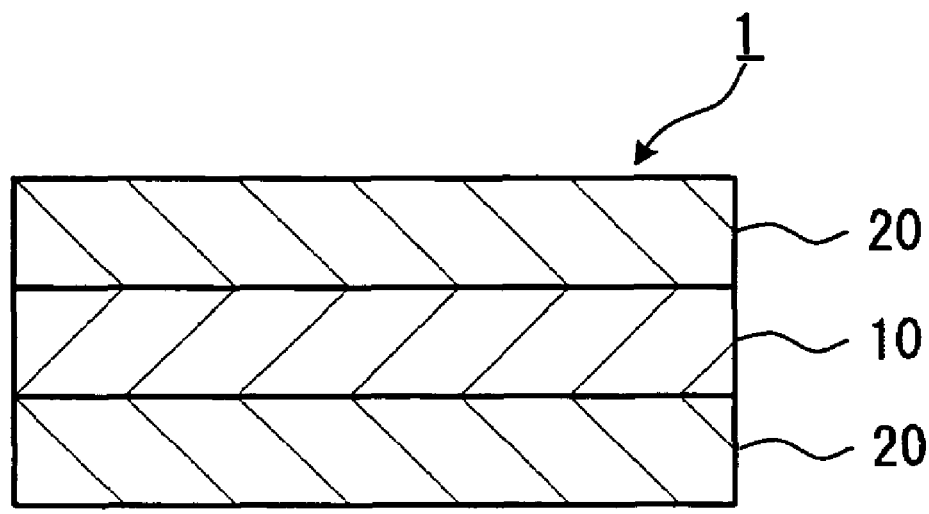
(b)
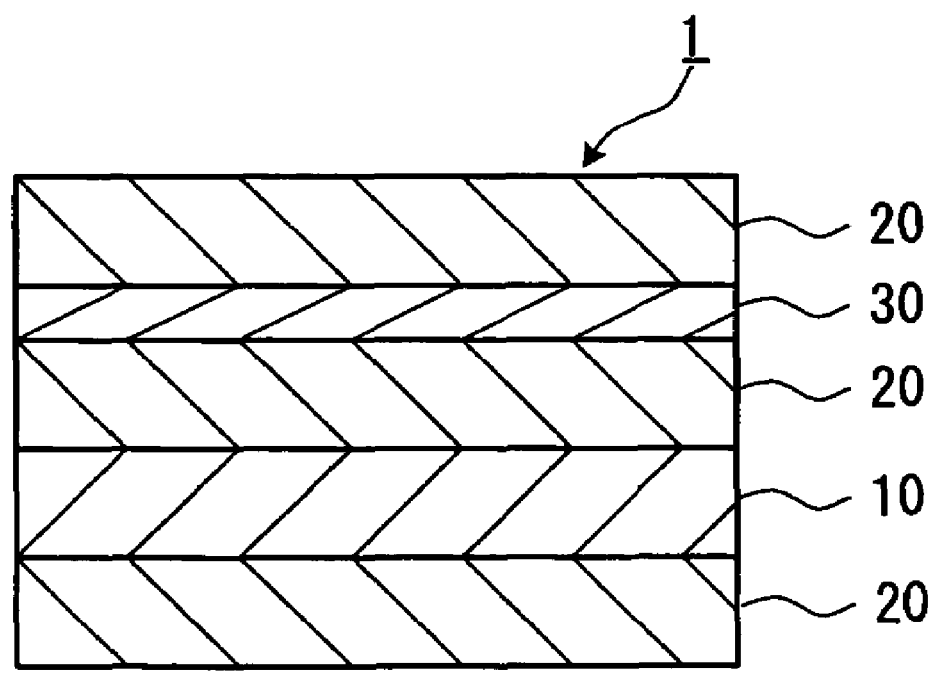

FIG. 6

| Sample No. | Flaky powder | Insulating material | Loading (wt%) | Heat treatment conditions | $\mu'$ (100MHz) | $\mu''$ (100MHz) |
|---|---|---|---|---|---|---|
| 1 | 4Mo Permalloy | A solution of 20 wt% perhydropolysilazane in xylene | 2 | In $N_2$, 600 °C, 60 min | 52 | 47 |
| 2 | 4Mo Permalloy | A solution of 20 wt% perhydropolysilazane in xylene | 3 | In $N_2$, 600 °C, 60 min | 56 | 48 |
| 3 | 4Mo Permalloy | A solution of 20 wt% perhydropolysilazane in xylene | 4 | In $N_2$, 600 °C, 60 min | 71 | 62 |
| 4 | 4Mo Permalloy | A solution of 20 wt% perhydropolysilazane in xylene | 5 | In $N_2$, 600 °C, 60 min | 58 | 56 |
| 5 | 4Mo Permalloy | A solution of 20 wt% perhydropolysilazane in xylene | 4 | In $N_2$, 600 °C, 60 min | 51 | 42 |
| Comparative Example 1 | 4Mo Permalloy | None | 0 | In $N_2$, 600 °C, 60 min | 9 | 12 |

\* For Sample No. 5, insulating treatment was conducted in the atmosphere of $N_2$

FIG. 9

| Sample No. | Flaky powder | Insulating material | Loading (wt%) | Heat treatment conditions | $\mu'$ (100MHz) | $\mu''$ (100MHz) |
|---|---|---|---|---|---|---|
| 3 | 2Mo Permalloy | A solution of 20 wt% perhydropolysilazane in xylene | 4 | In $N_2$, 600 °C, 60 min | 70 | 68 |
| Comparative Example 2 | 2Mo Permalloy | A solution of 20 wt% perhydropolysilazane in xylene | 4 | In $N_2$, 300 °C, 60 min | 7 | 9 |
| Comparative Example 3 | 2Mo Permalloy | A solution of 20 wt% perhydropolysilazane in xylene | 4 | In $N_2$, 900 °C, 60 min | 7 | 12 |

FIG. 11

| Sample No. | Flaky powder | Insulating material | Loading (wt%) | Heat treatment conditions | $\mu'$ (100MHz) | $\mu''$ (100MHz) |
|---|---|---|---|---|---|---|
| 4 | 4Mo Permalloy | Silicon coupling agent | 2 | In $N_2$, 700 °C, 60 min | 47 | 47 |
| 5 | 4Mo Permalloy | Titanate coupling agent | 2 | In $N_2$, 700 °C, 60 min | 38 | 40 |

FIG. 12

| Sample No. | Flaky powder | Insulating material | Loading (wt%) | Heat treatment conditions | $\mu'$ (100MHz) | $\mu''$ (100MHz) |
|---|---|---|---|---|---|---|
| 6 | 4Mo Permalloy | A solution of 20 wt% perhydropolysilazane in xylene | 3 | In $N_2$, 600 °C, 60 min | 47 | 34 |
| | | Silica sol | 2 | | | |
| Comparative Example 4 | Resin composite sheet | — | — | No heat treatment | 27 | 13 |
| Comparative Example 5 | Resin composite sheet | — | — | No heat treatment | 15 | 8 |

FIG. 13

| Sample No. | Flaky powder | Insulating material | Loading (wt%) | Heat treatment conditions | $\mu'$ (100MHz) | $\mu''$ (100MHz) |
|---|---|---|---|---|---|---|
| 7 | 4Mo Permalloy | BN | 2 | In N$_2$, 650 °C, 60 min | 28 | 33 |
|   |   | Silica sol | 4 |   |   |   |
| Comparative Example 1 | 4Mo Permalloy | None | 0 | In N$_2$, 600 °C, 60 min | 9 | 12 |

COMPOSITE MAGNETIC MATERIAL ELECTROMAGNETIC WAVE ABSORBING SHEET METHOD FOR MANUFACTURING SHEET-LIKE PRODUCT AND METHOD FOR MANUFACTURING ELECTROMAGNETIC WAVE ABSORBING SHEET

TECHNICAL FIELD

The present invention relates to a composite magnetic material for use in the components providing countermeasures against electromagnetic noises in high frequency regions, an electromagnetic wave absorbing sheet, a method for manufacturing the electromagnetic wave absorbing sheet, and the like.

BACKGROUND ART

Electronic devices including digital electronic devices typically represented by personal computers, game machines, or portable information terminals are promoted to undergo high densification of circuits, in parallel with the adaptation of circuits to high frequencies and the enhancement of circuit performance; thus passive elements tend to be affected by active elements such as semiconductors which radiate noises. Conventionally, as the countermeasures against these noises, ferrite core and electromagnetic wave absorbers for quasimicrowave band have been used; however, downsizing of electronic appliances comes to demand for the components as countermeasures against noises to be reduced in size and thickness and to be enhanced in performance.

For the purpose of meeting the EMC standard, it comes to be a critical challenge to meet the standard associated with noises around 100 to 400 MHz, and accordingly demand for electromagnetic wave absorbers and minute components as countermeasures against EMI, corresponding to this band, is growing. Japanese Patent Laid-Open No. 2000-4097 discloses a method for manufacturing a composite magnetic sheet that can attain high permeability for the frequencies of 100 MHz or less in which the resonance frequency is made to be reduced in such a way that a flaky magnetic powder is annealed to reduce the residual stress, and thereafter oriented along the in-plane direction and pressed perpendicularly to the sheet plane at a temperature of the glass transition temperature Tg of the organic bonding agent involved or higher. However, the permeability of such a composite magnetic sheet made of an organic bonding agent and a flaky magnetic powder is at most 20 at 100 MHz, so that high permeability is hardly obtainable.

Japanese Patent Laid-Open No. 11-74140 discloses a method for manufacturing a dust core, the method being characterized in that a flaky soft magnetic powder is used and the core is molded into a plate-like form by extrusion molding. The method has an advantage that the permeability can be made high because the flaky soft magnetic powder is oriented along the extrusion direction; however, when a sheet thinner than 0.4 mm is formed, the sheet is needed to be taken over by applying tension and to be made thinner immediately after the sheet has been extruded from a narrow nozzle, so that high permeability becomes hardly obtainable. In other words, it is necessary to lower the viscosity at the extrusion temperature by increasing the resin content so that a sufficient flexibility may be provided to take over the sheet when extruded from the narrow nozzle; accordingly, the filled content of the magnetic powder is reduced and hence high permeability cannot be obtained.

Other methods are also disclosed in which extrusion is not adopted but the print lamination method and the doctor blading are adopted to make the sheet thinner.

Japanese Patent Laid-Open No. 11-176680 discloses a method for manufacturing a core in which a 500 µm or less thick sheet is manufactured with a flaky soft magnetic metal powder from 5 to 40 of aspect ratio and a binder by means of the print lamination method, the sheets thus obtained are laminated to make a 10 mm or less thick laminate, and the laminate is subjected to press molding and subsequently to blanking to yield a core. However, even if this method is adopted, because this method uses a large amount of organic binder besides solvent, the packing density of the soft magnetic metal powder is hardly made to be higher than 75%; additionally, the stress deterioration involved in molding cannot be avoided, and a heat treatment capable of effectively relieving the residual stress cannot be applied, making it impossible to obtain high permeability for high frequencies around 100 MHz.

Japanese Patent Laid-Open No. 2000-243615 discloses a method for manufacturing a composite magnetic material in which a film is formed of a slurry-like mixture comprising a flaky soft magnetic powder, a binder and a solvent; the method is characterized in that the composite magnetic material is manufactured such that no stress strain is once again applied to the flaky soft magnetic powder from which the stress strain has been relieved; however, because the method in which no deformation stress is applied to the flaky soft magnetic powder itself has drawbacks including the fact that the method can hardly make the packing density of the material high and additionally the fact that the stress generation due to the curing and contraction of the resin cannot be avoided in principle, it cannot be expected to obtain high permeability for the high frequencies around 100 MHz.

Any of the conventional techniques is a technique based on a technological concept that puts particular emphasis on the consideration such that after the residual stress of the flaky soft magnetic metal powder has been reduced, no excessively large stress may be applied to the flaky soft magnetic metal powder in the molding step; such a technological concept involves two drawbacks that the packing density of the metal powder substantially cannot be made high and additionally the residual stress in the molded body cannot be made small, and leads to a limit in improving the complex permeability for the high frequencies ranging from several tens MHz to several GHz.

It is an object of the present invention to provide a thin (e.g., 0.4 mm or less) composite magnetic material, by overcoming the above described problems, which is excellent in the noise reduction effect in high frequencies, particularly, in the range from 100 to 400 MHz critical in meeting the EMC standard, a method for manufacturing a sheet-like product thereof, and the like. Additionally, the present invention takes as its another object to provide an electromagnetic wave absorbing sheet, by overcoming the above described problems, which has excellent permeability for high frequencies and a method for manufacturing the same.

DISCLOSURE OF THE INVENTION

According to the above described objects, the present invention provides a composite magnetic material, comprising a soft magnetic metal phase and an insulating phase which is interposed between the soft magnetic metal phase; wherein a magnetic powder comprising a flaky soft magnetic metal powder and an insulating film formed on the surface thereof is compression bonded; and the insulating film constitutes the insulating phase, while the flaky soft magnetic metal powder constitutes the soft magnetic metal phase. According to the composite magnetic material involved of the present invention, the packing density of the soft magnetic metal phase in relation to the composite magnetic material can be made to be 50% or more, furthermore, 75% or more.

The present inventors, in the course of making diligent development for the purpose of solving the above described objects, investigated mounting a sheet-like electromagnetic wave absorber within an electronic appliance. Then, in this case, the insulation between the electromagnetic wave absorber and the board and other circuit elements of the electronic appliance needed to be established. Accordingly, the present invention provides an electromagnetic wave absorbing sheet in which an electrical insulating layer is formed additionally on the above described composite magnetic material. The electromagnetic wave absorbing sheet is characterized in that the sheet comprises a soft magnetic layer which is formed in a predetermined thickness by heaping a magnetic powder comprising a flaky soft magnetic metal powder and an insulating film formed on the surface thereof, along the direction of the thickness thereof; and an electrical insulating layer covering the surface of the soft magnetic layer. In this case, the above described composite magnetic material forms the soft magnetic layer of the electromagnetic wave absorbing sheet. In this connection, the thickness of the flaky soft magnetic metal powder forming the soft magnetic layer is made to be, for example, 0.1 to 1 µm.

Additionally, it is preferable that in the soft magnetic layer, the flaky soft magnetic metal powder is oriented approximately along a certain direction. The thickness of the soft magnetic layer can be made to be 5 to 100 µm, and the thickness of the electrical insulating layer can be made to be 50 µm or less. The electrical insulating layer can be formed by means of a variety of procedures as will be described later.

Additionally, the packing density of the flaky soft magnetic metal powder in the soft magnetic layer can be made to be 75% or more, and the real part of the complex permeability at 100 MHz can be made to be 30 or more.

The insulating film can comprise inorganic polymers, oxides and nitrides. Additionally, the insulating film can also be formed of one or more kinds of the following substances: inorganic polymers such as polysilazane based polymers, organic insulating materials such as coupling agents, and inorganic insulating materials such as silica sol, titania sol, magnesia sol, alumina sol, glass powder, boron nitride and sericite.

The electromagnetic wave absorbing sheet of the present invention comprises the layer-like soft magnetic metal phase and the insulating phase which is interposed between the soft magnetic metal phase; specifically, the absorbing sheet comprises a 5 to 100 µm thick magnetic layer and a 50 µm or less thick insulating layer which is formed on both sides of the magnetic layer.

Such an electromagnetic wave absorbing sheet can further comprise a conductive layer made of a conductive material on the side of the insulating layer other than the side in contact with the magnetic layer. The side of the conductive layer opposite to the side in contact with the insulating layer is preferably covered with another insulating layer.

The insulating layer can be formed either by adhering a film formed of an electrical insulating material to the magnetic layer, or by coating the magnetic layer with an electrical insulating resin. In the latter case, an effect of reinforcing the magnetic layer is also offered, and the electrical insulating resin forming the insulating layer may penetrate into the voids between the particles of the magnetic powder forming the magnetic layer.

Additionally, the present invention provides a method for manufacturing sheet-like product represented by the above described composite magnetic material. The method comprising the steps of an insulating film formation step for forming an insulating film on the surface of flaky soft magnetic metal powder; and a bonding step for bonding the particles of the magnetic powder to each other by applying a pressing force under the condition such that there is deposited the magnetic powder wherein the insulating film is formed on the surface thereof.

It is preferable that the flaky soft magnetic metal powder is subjected to plastic deformation in the above described bonding step. Additionally, the method for manufacturing sheet-like product of the present invention, can be supplied with the magnetic powder wherein the insulating film is formed on the surface of the flaky soft magnetic metal powder classified to fall within the range from 40 to 120 µm. The use of the soft magnetic powder classified to fall within this range makes it possible to obtain sheet-like product excellent in magnetic properties.

The method for manufacturing sheet-like product, according to the present invention, is developed to a method for manufacturing an electromagnetic wave absorbing sheet. The method for manufacturing an electromagnetic wave absorbing sheet of the present invention, is characterized in that the method comprises a step for depositing the magnetic powder comprising the flaky soft magnetic metal powder and the insulating film formed on the surface of the powder, a step for producing a sheet-like product by bonding the particles of the magnetic powder to each other by applying a pressing force to the deposited magnetic powder, and a step for forming an insulating layer comprising an electrical insulating material on the surface of the sheet-like product.

The step for forming an insulating layer also comprises covering the surface of the sheet-like product with a film formed of an electrical insulating material. For the purpose of fixing the covering film to the sheet-like product, any of the methods including the adhesion, compression bonding and thermo-compression bonding methods can be adopted. Alternatively, a coating material containing an electrical insulating material (for example an electrical insulating resin) may be applied onto the surface of the sheet-like product.

The concept of the coating as referred to here comprises the concept that an electrical insulating resin is made to adhere onto the surface of the sheet-like product by soaking the sheet-like product into an electrical insulating resin. The applied coating material can be made to cure on the basis of a method appropriate to the coating material concerned.

Additionally, in the step for producing the sheet-like product, the flaky soft magnetic metal powder can undergo plastic deformation by rolling.

In the step for depositing the magnetic powder comprising the flaky soft magnetic metal powder and the insulating film formed on the surface thereof, the deposition may be carried out by dropping the magnetic powder from a sieve or by spraying the magnetic powder.

The present invention can be taken as a method for manufacturing an electromagnetic wave absorbing sheet, wherein the method comprising the steps of: an insulation treatment step for obtaining a magnetic powder comprising a flaky soft magnetic metal powder and an insulating film formed on the surface thereof by mixing the flaky soft magnetic metal powder and an insulating material together and thereby insulating the flaky soft magnetic metal powder; a rolling orientation step for obtaining, for example, a 5 to 100 µm thick sheet-like product by depositing the magnetic powder on a substrate and thereafter orienting the magnetic powder by rolling; a heat treatment step for relieving the residual strain in the flaky soft magnetic metal powder constituting the magnetic powder by subjecting the sheet-like product to heat treatment; and an insulating layer formation step for forming an insulating layer made of an electrical insulating material on the surface of the sheet-like product.

It is preferable to apply the heat treatment for relieving the strain to the flaky soft magnetic metal powder before the insulation treatment step. The heat treatment temperature in the heat treatment step for the sheet-like product is 400 to 800° C., preferably 500 to 800° C., more preferably 600 to 800° C.; it is preferable that the heat treatment atmosphere is inert gas, nitrogen or hydrogen.

BRIEF DESCRIPTION OF THE DRAWINGS

FIG. 1 is a schematic diagram illustrating the configurations of electromagnetic wave absorbing sheets;

FIG. 6 is a diagram showing the complex permeabilities at 100 MHz for the samples in which 2, 3, 4 and 5 wt % of a perhydropolysilazane solution was added;

FIG. 9 is a diagram showing the complex permeabilities of the 20 µm thick samples involved in Example 2 of the present invention;

FIG. 11 is a diagram showing the complex permeabilities of the 25 µm thick samples involved in Example 4 of the present invention;

FIG. 12 is a diagram showing the complex permeabilities of the 25 µm thick µm samples involved in Example 5 of the present invention;

FIG. 13 is a diagram showing the complex permeabilities of the 30 µm thick samples involved in Example 6 of the present invention;

BEST MODE FOR CARRYING OUT THE INVENTION

Figure 2:
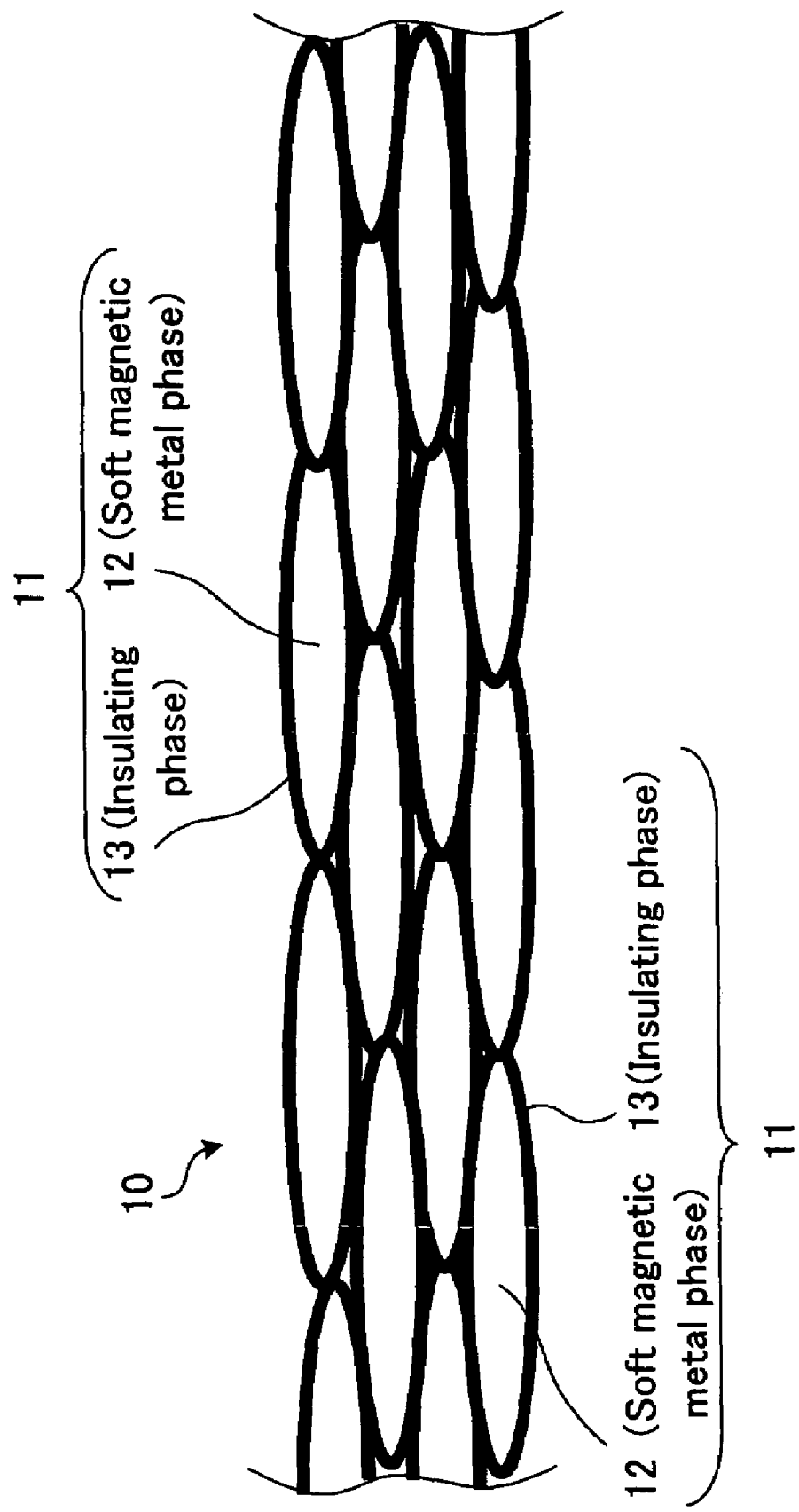
FIG. 2 is a schematic diagram illustrating the magnetic layer constituting an electromagnetic wave absorbing sheet.

Description will be made below on an embodiment of the present invention.

As shown in FIG. 1(a), the electromagnetic wave absorbing sheet 1 in the present embodiment has a configuration in which insulating layers 20 (electrical insulating layers) are formed on both sides of a magnetic layer (soft magnetic layer) 10. Here, the total thickness of the magnetic layer 10 is preferably 5 to 100 µm in thickness. The total thickness of the insulating layers 20 is preferably 50 µm or less, more preferably 15 µm or less.

As shown in FIG. 1(b), the electromagnetic wave absorbing sheet 1 can also be provided with a conductive layer 30 on one of the insulating layers 20 respectively arranged on both sides of the magnetic layer 10, in such a way that the conductive layer 30 is in contact with the side of the insulating layer 20 concerned opposite to the side thereof in contact with the magnetic layer 10. The conductive layer 30 is formed of a conductive material such as copper and carbon, the purpose thereof being the grounding of the electromagnetic wave absorber 1. In this case, the conductive layer 30 is covered with another insulating layer 20 as an additional insulating.

FIG. 2 schematically shows the magnetic layer 10 constituting the electromagnetic wave absorbing sheet 1. The magnetic layer 10 is formed by densely depositing a large amount a flaky magnetic powder 11. Incidentally, in the present embodiment, the magnetic layer 10 is described as the electromagnetic wave absorbing sheet 1 in combination with the insulating layers 20, but needless to say, can also exist alone as a sheet-like composite magnetic material.

Each magnetic powder 11 is a composite magnetic material formed of a soft magnetic metal phase 12 made of a flaky soft magnetic metal powder and an insulating phase 13 made of an insulating film formed on the surface of the soft magnetic metal phase 12. Accordingly, the insulating phase 13 comes to be interposed between the mutually adjacent soft magnetic metal phases 12. Thus, the magnetic layer 10 has a configuration in which the magnetic powder 11 formed of a flaky soft magnetic metal powder with an insulating film formed on the surface thereof are heaped along the thickness direction thereof to form a predetermined thickness.

At the beginning, description will be made below on the flaky soft magnetic metal powder constituting the soft magnetic metal phase 12.

The flaky soft magnetic metal powder is Permalloy (Fe—Ni alloy), Superpermalloy (Fe—Ni—Mo alloy), Sendust (Fe—Si—Al alloy), an Fe—Si alloy, an Fe—Co alloy, an Fe—Cr alloy, an Fe—Cr—Si alloy or the like, and the aspect ratio thereof is 10 to 200, more preferably 10 to 150.

The thickness of the flaky soft magnetic metal powder (prior to rolling) is preferably made to be 0.1 to 1 μm. It is difficult to make the thickness of the flaky soft magnetic metal powder less than 0.1 μm from a viewpoint of manufacturing, and such thickness makes the handling difficult. The thickness of the flaky soft magnetic metal powder exceeds 1 μm is not preferable because the magnetic properties in the high frequencies are caused to be degraded. Even when the flaky soft magnetic metal powder is subjected to compression bonding, the powder thickness exhibits little change. Accordingly, the thickness of the flaky soft magnetic metal powder after the compression bonding also falls within the range from 0.1 to 1 μm.

Next, description will be made on the insulating film constituting the insulating phase 13.

It is ideal that the insulating film is formed uniformly all over the surface of the flaky soft magnetic metal powder as shown in FIG. 2; however, even if there are some surface portions where no insulating film is formed, it is sufficient that the insulating film is formed to such extent that the insulating film can function as the insulating phase 13 after completion of compression bonding.

The insulating film is formed on the surface of the flaky soft magnetic metal powder by mixing the flaky soft magnetic metal powder and an insulating material together and by subjecting the mixture thus obtained to a prescribed treatment. Both organic and inorganic materials can be used as the insulating material. More specifically, polysilazane based materials including an inorganic polymer of perhydropolysilazane are preferable; silane based coupling agents and titanate based coupling agents, and inorganic insulators including silica sol, titania sol, magnesia sol, alumina sol, glass powder and boron nitride can be used as the insulating material; and these inorganic insulators may be used in combination with perhydropolysilazane.

The insulating layer 20 shown in FIG. 1 is a layer formed of an insulating material, which can be formed, for example, by adhering a resin film onto the magnetic layer 10 or by applying an insulating material onto the magnetic layer 10.

As the insulating material for imparting electrical insulating property to the surface of the electromagnetic wave absorbing sheet 1, resins are suitable, and particularly those resins which are excellent in strength, insulating property and flame resistance are preferable. Specific examples for forming the insulating layer 20 include phenolic resin, urea resin, melamine resin, Teflon®, polyimide, polyvinyl chloride, flame resistant polyethylene, flame resistant polypropylene, flame resistant polystyrene, polyphenylenesulfide, flame resistant PET, flame resistant PBT, flame resistant polyolefin, silicone resin and epoxy resin; when a flame retardant for improving the flame resistance is added, it is preferable to use non-halogen flame retardants.

Figure 3:
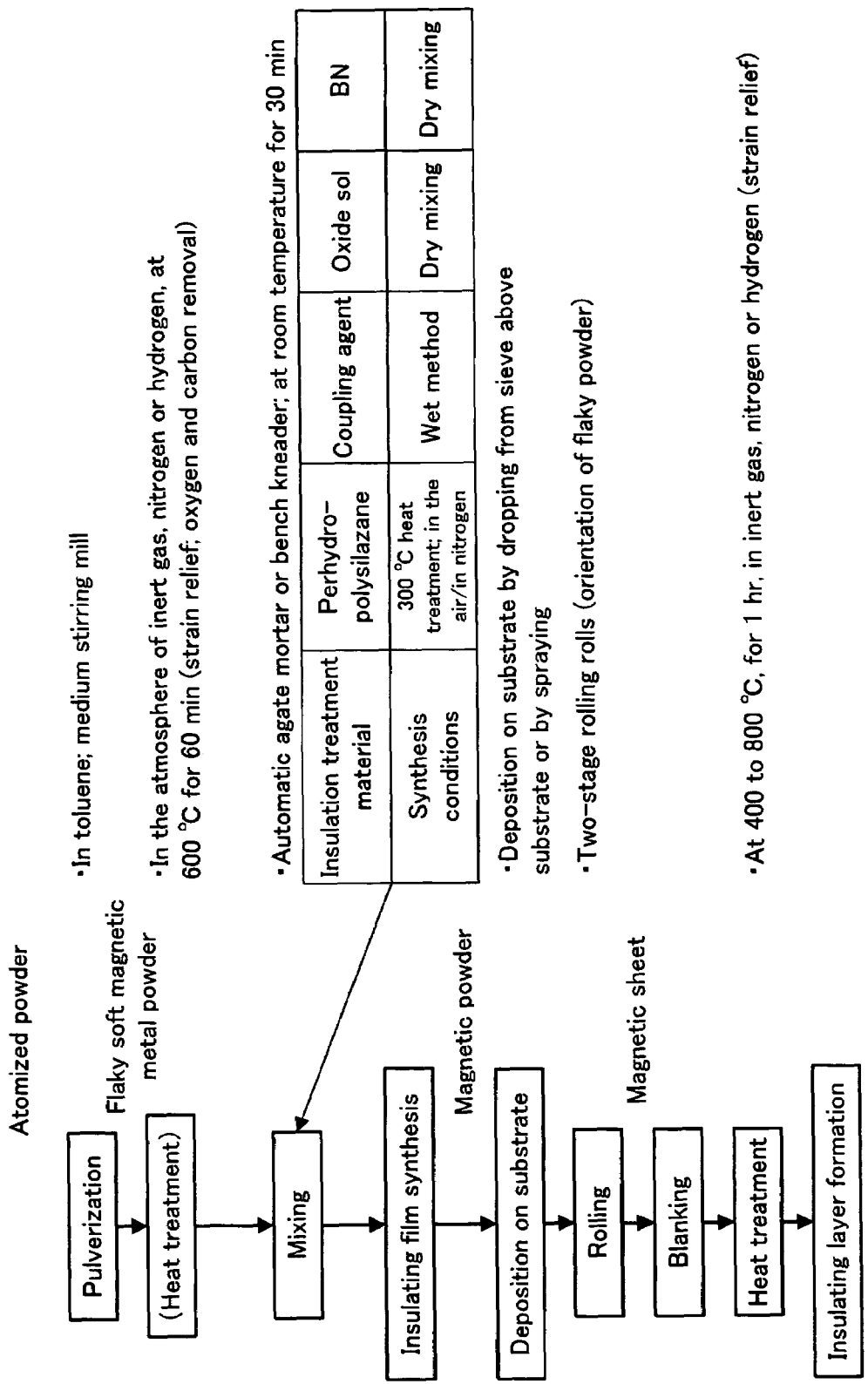
FIG. 3 is a diagram showing the steps for manufacturing an electromagnetic wave absorbing sheet involved in an embodiment of the present invention.

FIG. 3 is a diagram showing the steps for manufacturing the electromagnetic wave absorbing sheet 1 involved in the present embodiment.

At the beginning, in the pulverization step, an atomized powder of a soft magnetic metal of 10 μm in mean particle size is pulverized in an organic solvent such as toluene and like by means of, for example, a stirrer mill, and a flaky soft magnetic metal powder of 0.1 to 1 μm in particle thickness and 10 to 200 in aspect ratio is obtained. In this case, the particle size distribution of the flaky soft magnetic metal powder is not necessarily required to be sharp, but may have a double-peak distribution.

On completion of the pulverization step, the heat treatment step is conducted. In the heat treatment step, the flaky soft magnetic metal powder is heat treated in the atmosphere of an inert gas, nitrogen or hydrogen, for example, at 600° C. for 60 minutes. Consequently, the strain caused in the pulverization step for flaking the soft magnetic metal powder is relieved, and additionally the oxygen and carbon which have been mixed in the soft magnetic metal powder during the pulverization are removed. The heat treatment step is not indispensable, but because it is preferable that the flaky soft magnetic metal powder has a small strain (magnetostriction), it is desirable that the flaky soft magnetic metal powder is subjected to the heat treatment in advance of the insulation treatment step to be described later and thereby the strain of the flaky soft magnetic metal powder is relieved.

Next, the insulation treatment step (insulating film formation step) is conducted. In this step, the flaky soft magnetic metal powder and an insulating material (liquid or fine powder) are mixed together, and the powder subjected to the insulation treatment, namely, the magnetic powder 11 in which the insulating film is formed on the surface of the flaky soft magnetic metal powder is manufactured. The insulation treatment step applies different treatment methods depending on the type of the insulating material. Description is made below on the respective treatment methods for the following cases: <1> the case in which the insulating material is perhydrosilazane, <2> the case in which the insulating material is a coupling agent (silane based agent, titanate based agent and the like), <3> the case in which the insulating material is one of the sols of other oxides or BN (boron nitride).

<1> In the case where the insulating material is perhydropolysilazane, the flaky soft magnetic metal powder and perhydropolysilazane are mixed together by means of a mixing apparatus. On completion of mixing, the heat treatment is conducted for example, in the air or in the nitrogen atmosphere at 300° C. for 60 minutes. Perhydropolysilazane is transformed into $SiO_2$ when treated in the air, and into $Si_3N_4$ when treated in the nitrogen atmosphere.

<2> In the case where the insulating material is a coupling agent (silane based agent, titanate based agent and the like), the surface of the metal powder is covered by means of a wet treatment method. The wet treatment method is a method in which while the flaky soft magnetic metal powder is stirred and mixed in a coupling agent diluted by a factor of 50 to 100 with a solvent, the surface treatment is carried out by evaporating the solvent.

<3> In the case where the insulating material is one of the sols of other oxides or BN (boron nitride), the flaky soft magnetic metal powder and an insulating material are directly mixed together (dry mixing) by means of a mixing apparatus.

Successively, the rolling orientation step (bonding step) is conducted. In the rolling orientation step, at the beginning, the flaky soft magnetic metal powder (magnetic powder 11) with the insulating film formed thereon is subjected to compression bonding. Specifically, the magnetic powder 11 is deposited on a substrate nearly uniformly by sieving and dropping the magnetic powder 11 from a sieve. In this connection, without using a sieve, the magnetic powder 11 can be deposited on a substrate by spraying the magnetic powder 11 onto the substrate using a spray.

Then, rolling is applied by means of a rolling roller to the substrate on which the magnetic powder 11 is deposited nearly uniformly in such a way that the powder subjected to the insulation treatment is made to orient along a direction parallel with the substrate (rolling orientation step). This step permits obtaining a 5 to 100 µm thick magnetic sheet (composite magnetic material) which constitutes the magnetic layer 10. According to need, the magnetic sheet (composite magnetic material) may be subjected to blanking (blanking step).

In the rolling orientation step, the insulation treated powder (magnetic powder 11) is made to free-fall from a holding container such as a sieve situated 3 mm or more above the surface of the substrate, and the insulation treated powder (magnetic powder 11) is made to be in-plane oriented and subsequently subjected to rolling, permitting improving the orientation found on completion of rolling.

Alteration of the particle size of the insulation treated powder (magnetic powder 11) by appropriately selecting the mesh size of the sieve permits setting the magnetic properties of the finally obtained magnetic sheet (composite magnetic material) to fall respectively within certain optional ranges. The mesh size range of the sieve is preferably 20 to 120 µm, more preferably 40 to 120 µm, and further more preferably 53 to 106 µm.

The fact that thickness of the magnetic sheet (composite magnetic material) which constitutes the magnetic layer 10 formed therein is made to be 5 to 100 µm is based on the following grounds: for the sheet thickness less than 5 µm, sintering can afford a sufficiently high permeability for high frequencies, so that the necessity of the magnetic sheet (composite magnetic material) is low; and on the other hand, there is a constraint condition such that the sheet thickness exceeding 100 µm makes it difficult to mount the electromagnetic wave absorbing sheet 1 with the magnetic layer 10 formed therein in a narrow space of the case of an electric appliance.

The fact that thickness of the magnetic sheet (composite magnetic material) is made to be 5 µm to 0.4 mm is based on the following grounds: for the sheet thickness less than 5 µm, sintering can afford a sufficiently high permeability for high frequencies, so that the necessity of the magnetic sheet (composite magnetic material) is low; and on the other hand, the sheet thickness exceeding 0.4 mm makes it difficult to use the electromagnetic wave absorbing sheet 1 for shielding the cables arranged within the case, in the interior of a portable information terminal, or in the neighborhood of a narrow space to mount a back light for liquid crystal. Accordingly, the sheet thickness is made to be 5 µm to 0.4 mm. The more preferable sheet thickness is 10 µm to 0.2 mm. The sheet thickness constrained to fall within this range facilitates the molding and permits obtaining high permeability for high frequencies.

Incidentally, the rolling orientation step (bonding step) has been described above taking the rolling as an example, but the step concerned is not restricted to the rolling. As far as a pressing force sufficient to cause plastic deformation of the flaky soft magnetic metal powder constituting the magnetic powder 11 can be exerted, other pressurization molding methods including the press working may be used; however, from the viewpoint of pressurization, the rolling is the most desirable.

Next, the blanked magnetic sheet (composite magnetic material) is subjected to the heat treatment, which relieves the residual strain found after the plastic deformation in the flaky soft magnetic metal powder (heat treatment step) For the purpose of avoiding the marked oxidation of the flaky soft magnetic metal powder, it is preferable that the atmosphere for the heat treatment is the atmosphere of an inert gas such as Ar, nitrogen or hydrogen.

The heat treatment temperature is made to fall within the range from 400 to 800° C. When the heat treatment temperature is lower than 400° C., the residual strain relieving effect is small, while when the heat treatment temperature exceeds 800° C., the insulation function of the insulating film formed on the surface of the flaky soft magnetic metal powder is damaged. The heat treatment time is recommended to be of the order of 1 hour.

After undergoing the above described steps, the 5 to 100 µm sheet-like magnetic layer 10 involved in the present embodiment is obtained as a sheet-like product.

Then, the insulating layer 20 is formed on both sides of the magnetic layer 10.

For that purpose, an insulating sheet formed in a sheet-like shape of a predetermined thickness is adhered to the magnetic layer 10 which can make the insulating layer 20. In this case, the insulating sheet forming the insulating layer 20 can be formed of such materials as described above.

The adhesion of the insulating sheet forming the insulating layer 20 to the magnetic layer 10 can be made simply by using an adhesive applied onto the surface of the sheet-like magnetic layer 10 or onto the insulating sheet forming the insulating layer 20. As the adhesive, preferable are epoxy resins and silicone resins both having insulating property and heat resistance. Additionally, similarly to a so-called laminated film, it is also conceivable that a layer of an adhesive is formed on the surface of the insulating sheet forming the insulating layer 20 and the layer of an adhesive is compression bonded to the sheet-like magnetic layer 10. In this case, the so-called thermo-compression bonding method can be adopted in which the adhesive layer of the insulating layer 20 is melted by heating when the sheet-like magnetic sheet 10 is compression bonded to the insulating layer 20.

Alternatively, without using an adhesive, the insulating sheet forming the insulating layer 20 may be thermo-compression bonded to the magnetic layer 10.

Further alternatively, for the purpose of forming the insulating layer 20, such materials as described above can be directly applied onto the surface of the magnetic layer 10 and allowed to cure. In other words, the insulating layer 20 is formed by coating with an insulating material.

The following resins are preferable as the coating material to be used in this case: silicone resin, silicone rubber resin, epoxy resin, epoxy-silicone composite resin, butyral resin, acryl based resin, ethylcellulose based resin, polyprolpylene based resin, styrene-butadiene resin, polybutylene based resin, and the like. Additionally, the above described coupling agents and adhesives can also be used.

When a resin layer is formed as the insulating layer 20 on the surface of the magnetic sheet forming the magnetic layer 10, the following methods can be appropriately adopted: a method in which the magnetic sheet forming the magnetic layer 10 is soaked in the resin, a method in which the resin is sprayed with a spray onto the magnetic sheet forming the magnetic sheet 10, and the like. When the magnetic sheet forming the magnetic layer 10 is soaked in the resin, the resin solution is prepared by diluting the resin with a solvent such as toluene, xylene, ethanol, acetone or the like, and the magnetic sheet forming the magnetic layer 10 is soaked in the resin solution for about 3 to 20 minutes.

When an insulating film is adhered as the insulating layer 20 to the magnetic layer 10 as described above, the insulating film can be made to reinforce the magnetic sheet forming the magnetic layer 10.

Alternatively, when a resin is applied for the purpose of forming the insulating layer 20, the applied resin can also be made to reinforce the magnetic sheet forming the magnetic layer 10.

Additionally, when the insulating layer 20 is formed by adhering the insulating sheet, a resin can be applied as described above for the purpose of reinforcement. In this case, the strength of the magnetic sheet forming the magnetic layer 10 may be increased by using a material other than resins.

Incidentally, in some case, the resin is soaked into the interior of the magnetic sheet, and consequently the resin layer is not formed on the surface of the magnetic sheet; however, even in this case, the resin functions to bond the particles of the magnetic powder 11 to each other in the interior of the magnetic sheet, and hence the strength of the magnetic sheet can be increased. The strength of the magnetic sheet may also be increased by using a material other than resins.

By successively forming such insulating layers 20 on both sides of the magnetic layer 10, the electromagnetic absorbing sheet 1 shown in FIG. 1 is obtained.

The measurement of the magnetic properties of the electromagnetic wave absorbing sheet 1 involved in the present embodiment is conducted at the measurement step. The obtained results are shown in the <Examples>.

Figure 4:
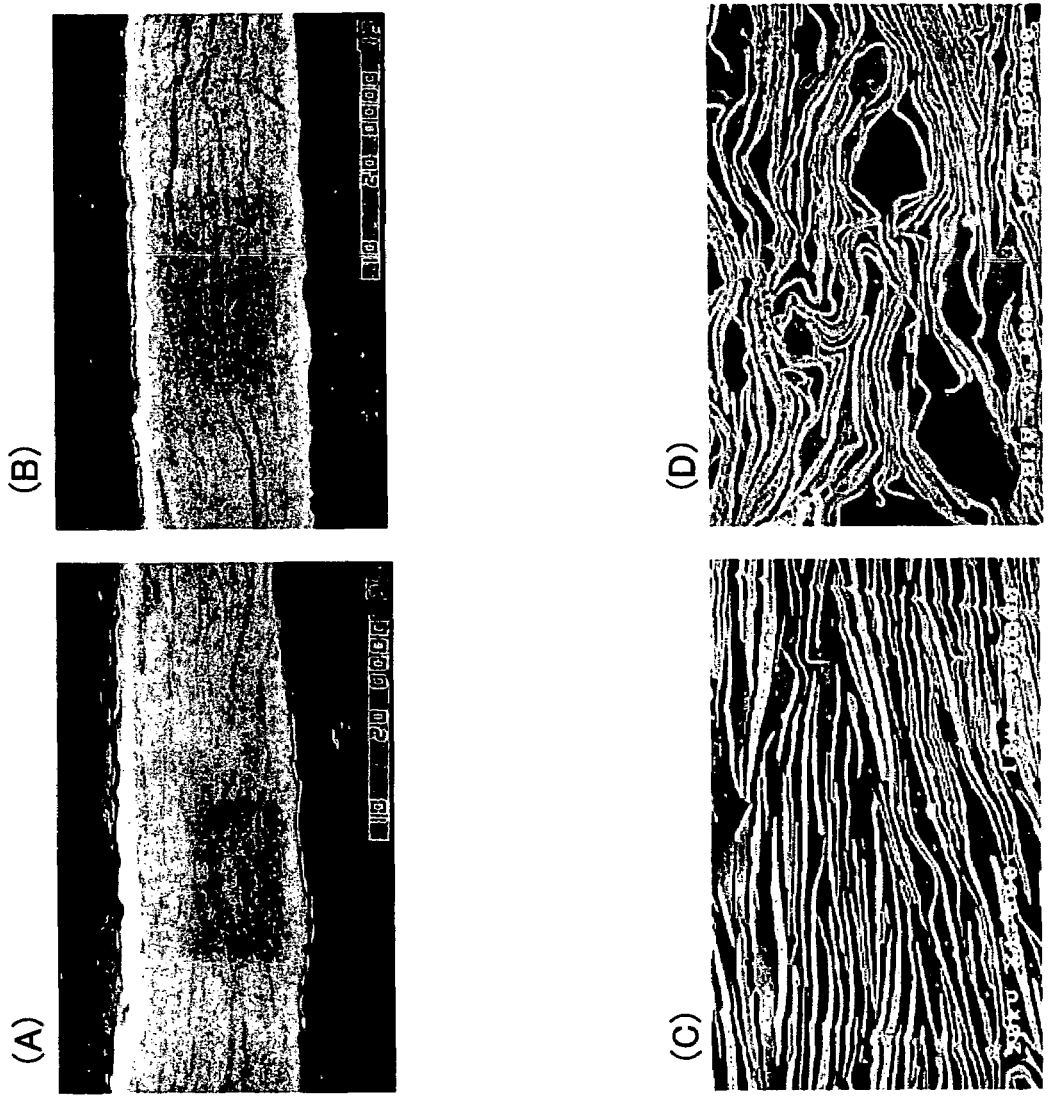
FIG. 4 shows the enlarged sectional views of the magnetic sheets involved in the present invention in comparison with conventional magnetic sheets, (A) showing the enlarged sectional view of a magnetic sheet (packing density: 87%) of the present invention, (B) showing the enlarged sectional view of a magnetic sheet (packing density: 78%) of the present invention, (C) the enlarged sectional view of a conventional magnetic sheet made of a flaky soft magnetic metal powder and a resin (chlorinated polyethylene), and (D) showing the enlarged sectional view of a conventional magnetic sheet obtained by molding a mixed powder consisting of a flaky soft magnetic metal powder, an urethane resin and a BN powder.

Next, description will be made below on the packing density of the flaky soft magnetic metal powder in the magnetic sheet forming the magnetic layer 10 involved in the present embodiment with reference to FIG. 4.

FIGS. 4(A) and (B) are the enlarged sectional views of the magnetic sheets forming the magnetic layers 10 involved in the present embodiment; and FIGS. 4(C) and (D) are the enlarged sectional views of conventional magnetic sheets.

The conventional composite magnetic material shown in FIG. 4(C) is constituted with a flaky soft magnetic metal powder and a resin (chlorinated polyethylene). The conventional magnetic sheet shown in FIG. 4(D) is obtained by press molding a mixed powder consisting of a flaky soft magnetic metal powder, an urethane resin and a BN powder. The packing densities of the flaky soft magnetic metal powder in the conventional magnetic sheets shown in FIGS. 4(C) and (D) have been investigated and the packing densities (volume %) have been found to be at most 40%.

On the other hand, the packing densities of the flaky soft magnetic metal powder in the magnetic sheets forming the magnetic layers 10 involved in the present embodiment shown in FIGS. 4(A) and (B) have been investigated, and the packing density for FIG. 4(A) has been found to be 87%, and the packing density for FIG. 4(B) has been found to be 78%. From the results, it can be presumed that according to the magnetic sheet forming the magnetic layer 10 involved in the present embodiment, the packing density of the flaky soft magnetic metal powder can be made to be 75% or more, and furthermore, the packing density of the flaky soft magnetic metal powder can be made to be 90% or more. For the packing density of the flaky soft magnetic metal powder, the preferable range is 60 to 90%, and the more preferable range is 70 to 85%. If the packing density of the flaky soft magnetic metal powder is less than 50%, the magnetic properties are degraded. On the other hand, the packing density of the flaky soft magnetic metal powder exceeds 95%, the moldability is degraded.

The magnetic sheet forming the magnetic layer 10 involved in the present embodiment has a packing density of the soft magnetic metal phase 12, namely, the flaky soft magnetic metal powder is 75% or more, and hence has satisfactory magnetic properties. In the present embodiment, the packing densities of the flaky soft magnetic metal powder are those values which have been calculated by taking account of the silicon oxide on the surface of the flaky soft magnetic metal powder.

Observation of the section of the magnetic sheet forming the magnetic layer 10 of the present embodiment has confirmed that the flaky soft magnetic metal powder of 0.1 to 1 μm in thickness are plastically deformed and the flaky soft magnetic metal powder is heaped in layers; additionally, the individual particles of the flaky soft magnetic metal powder have a structure insulated by an oxide or an nitride. In other words, the magnetic sheet forming the magnetic layer 10 of the present embodiment has been confirmed to have a structure in which the insulating phase 13 is interposed between the lamellar soft magnetic metal phase 12. The magnetic sheet forming the magnetic layer 10 of the present embodiment has a structure which can simultaneously achieve a small demagnetizing field and a small eddy current. The magnetic sheet forming the magnetic layer 10 of the present embodiment can attain a much larger complex permeability at 100 MHz than the conventional composite magnetic materials.

EXAMPLES

Detailed description will be made below on the electromagnetic wave absorbing sheet 1 of the present invention and the magnetic layer 10 (magnetic sheet, composite magnetic material) constituting the electromagnetic wave absorbing sheet 1 on the basis of Examples.

Example 1

As described in the diagram for the manufacturing steps shown in FIG. 3, a water atomized 4Mo Permalloy powder (80Ni-4Mo-1Si-bal.Fe (mol %)) of 20 μm in mean particle size, as the soft magnetic metal powder, was pulverized and flaked in a medium stirring mill using toluene as solvent, and thereby transformed into a flaky soft magnetic metal powder (hereinafter referred to as "flaky powder" as the case may be) of 40 μm in mean particle size, 0.2 to 0.6 μm in particle thickness, and 30 to 120 in aspect ratio. The mean particle size of the powder was measured by means of a particle size distribution analyzer (Microtrac Particle Size Analyzer, manufactured by Nikkiso Co., Ltd.) taking advantage of the light scattering.

Then, for the purpose of relieving the strain caused by the pulverization for flaking the above described metal powder, and also for the purpose of removing the oxygen and carbon mixed in the powder in the pulverization, heat treatment was made at 600° C. for 60 minutes.

As the material for forming the insulating layer 13, perhydropolysilazane (Tonen polysilazane L110, 20 wt % xylene solution) was used. The loading of the 20 wt % xylene solution of perhydrosilazane to the flaky Mo Permalloy powder was set at 4 wt %. The flaky Mo Permalloy powder and perhydropolysilazane were mixed together at room temperature for 30 minutes by use of a mixing apparatus (a automatic agate mortar, a bench kneader and the like). Then, the mixture was allowed to stand in the air at 300° C. for 60 minutes to transform perhydropolysilazane into $SiO_2$, thereby the insulating film being formed on the surface of the flaky Mo Permalloy powder.

Then, the above described insulation treated flaky powder (magnetic powder 11) was deposited nearly uniformly on a stainless steel substrate while sieving using a sieve (mesh size: 125 μm or less) 10 mm above the stainless steel substrate. The stainless steel substrate was subjected to rolling by being passed between a two stage of cold rolling rolls of 50 mm in roll diameter, and thus the individual flaky powder is oriented parallel to the substrate, yielding an about 20 μm thick sheet-like shape.

Successively, the sheet was subjected to the heat treatment at 600° C. for 60 minutes for the purpose of removing the strain caused by the pulverization to flake the metal powder and also for the purpose of removing the oxygen and carbon mixed in the powder during the pulverization.

Thereafter, for the purpose of reinforcing the sheet and imparting insulation property to the sheet, the sheet was soaked in a xylene solution of a room-temperature curing silicone (20%) for 20 minutes, and then dried, thus yielding a sheet-like product forming the electromagnetic wave absorbing sheet 1.

The sheet-like product was blanked into a toroidal shape, and the frequency dependence of the complex permeability (real part: $\mu'$; imaginary part: $\mu''$) was measured by the one turn method. As a representative example, the μ-frequency curve for the sample No. 3 in which 4 wt % perhydropolysilazane was added is shown in FIG. 5.

Additionally, the complex permeability (real part: $\mu'$; imaginary part: $\mu''$) values at 100 MHz for the samples in which the loadings were 2, 3, 4 and 5 wt % are shown in FIG. 6. Furthermore, as for the insulation treatment with perhydropolysilazane, the treatment was conducted either in the air or in the atmosphere of nitrogen, the results obtained being also shown in FIG. 6.

Figure 5:
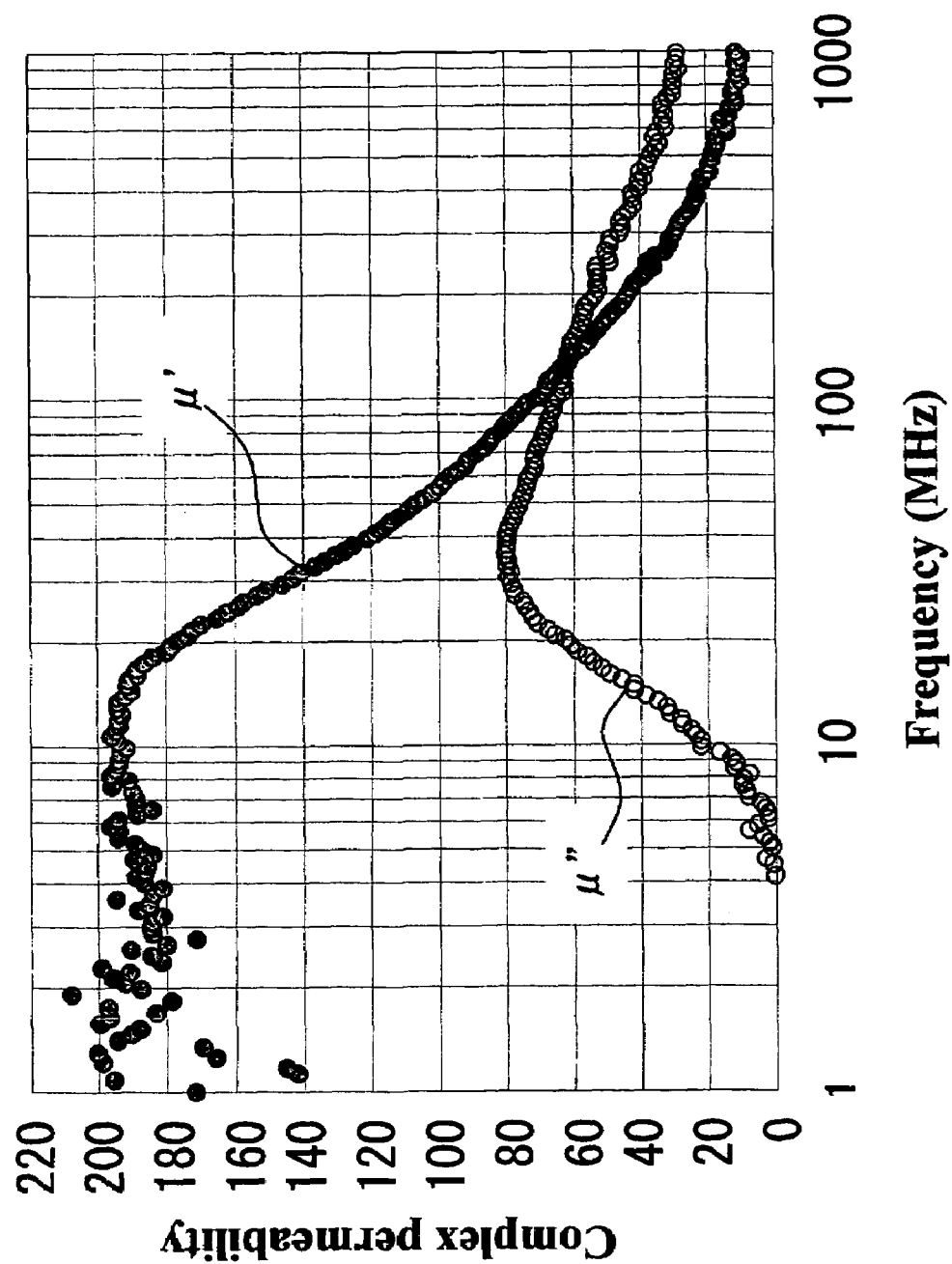
FIG. 5 is a graph showing the frequency dependence of the complex permeability of a 20 µm thick sample involved in Example 1 of the present invention in which 4 wt % of a perhydropolysilazane solution was used.

As shown in FIGS. 5 and 6, the samples No. 1 to 5 comprising the magnetic powder 11 insulated with perhydropolysilazane exhibit at 100 MHz the $\mu'$ values of 50 or more and the $\mu''$ values of 40 or more. On the other hand, the comparative example 1 to which no insulation treatment was applied exhibits at 100 MHz a $\mu'$ value of 9 and a $\mu''$ value of 12, both being insufficient.

A comparison between the complex permeability of the sample No. 5 insulated with perhydopolysilazane in the atmosphere of nitrogen and the complex permeability of the sample No. 3 insulated with perhydopolysilazane in the air confirms that the sample No. 3 exhibits a better value.

Figure 7:
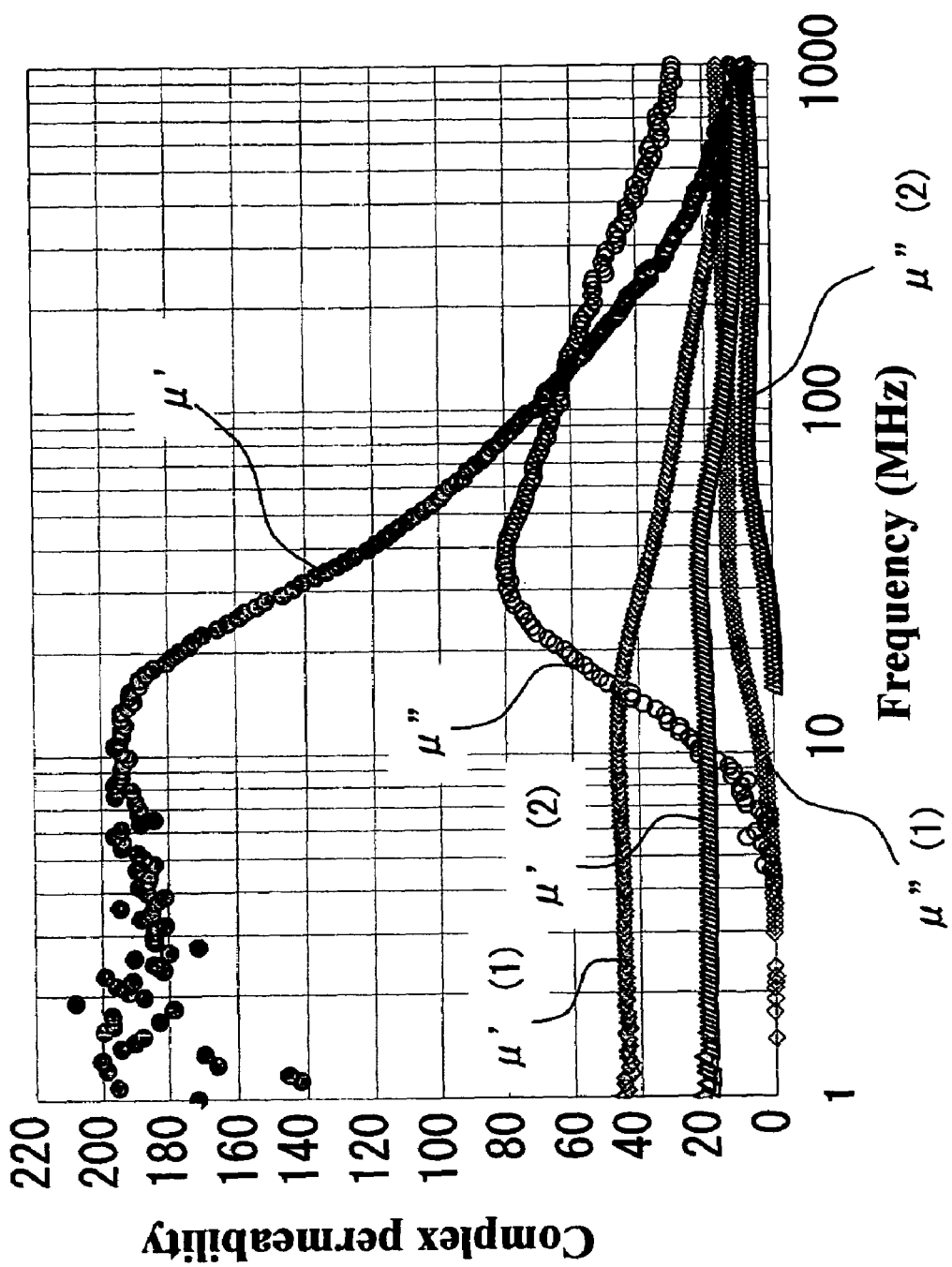
FIG. 7 is a graph showing the frequency dependence of the complex permeability of a 20 µm thick sample involved in Example 1 of the present invention in which 4 wt % of a perhydropolysilazane solution was used, in comparison with a conventional resin composite sheet.

The frequency dependence of the complex permeability (real part: $\mu'$; imaginary part: $\mu''$) of the sample No. 3 is shown in FIG. 7, in comparison with that of a conventional resin composite sheet blanked in a similar shape. It should be noted that the sample No. 3 is the sample that was the best as far as the properties were concerned (the sample with 4 wt % of the xylene solution of perhydropolysilazane in relation to the flaky soft magnetic metal powder). The resin composite sheet (1) shown in FIG. 7 contains 40 volume % of the flaky soft magnetic metal powder, and the resin composite sheet (2) shown in FIG. 7 contains 30 volume % of the flaky soft magnetic metal powder.

From FIG. 7, the sample No. 3 can be confirmed to have a markedly larger complex permeability than the conventional resin composite sheets.

When the sample No. 3 was soaked in the resin and subjected to sectional observation, a structure (packing density was 78%) was observed in which the flaky soft magnetic metal powder subjected to plastic deformation in the rolling treatment was heaped in layers, as shown in FIG. 4(B).

Example 2

A water atomized 2Mo Permalloy powder (80Ni-2Mo-bal.Fe (mol %)) of 30 μm in mean particle size, as the soft magnetic metal powder, was used, and was transformed, in a manner similar to that in the above described Example 1, into a flaky powder of 50 μm in mean particle size, 0.1 to 0.8 μm in particle thickness, and 10 to 150 in aspect ratio. Additionally, by means of a similar procedure, the insulation treatment was conducted and the rolling orientation treatment was conducted by passing the flaky powder between the cold rolling rolls, to produce an about 20 μm thick sheet-like product forming the magnetic layer 10. It should be noted that the loading of the solution of 20 wt % perhydropolysilazane in xylene was set to be 4 wt % in relation to the flaky powder. The sheet-like product was blanked into a toroidal shape and was subjected to the heat treatment at 300° C., 600° C., and 900° C. for 60 minutes, and was subject to the evaluation of the frequency dependence of the complex permeability (real part: $\mu'$; imaginary part: $\mu''$). The results obtained are shown in FIGS. 8 and 9.

Figure 8:
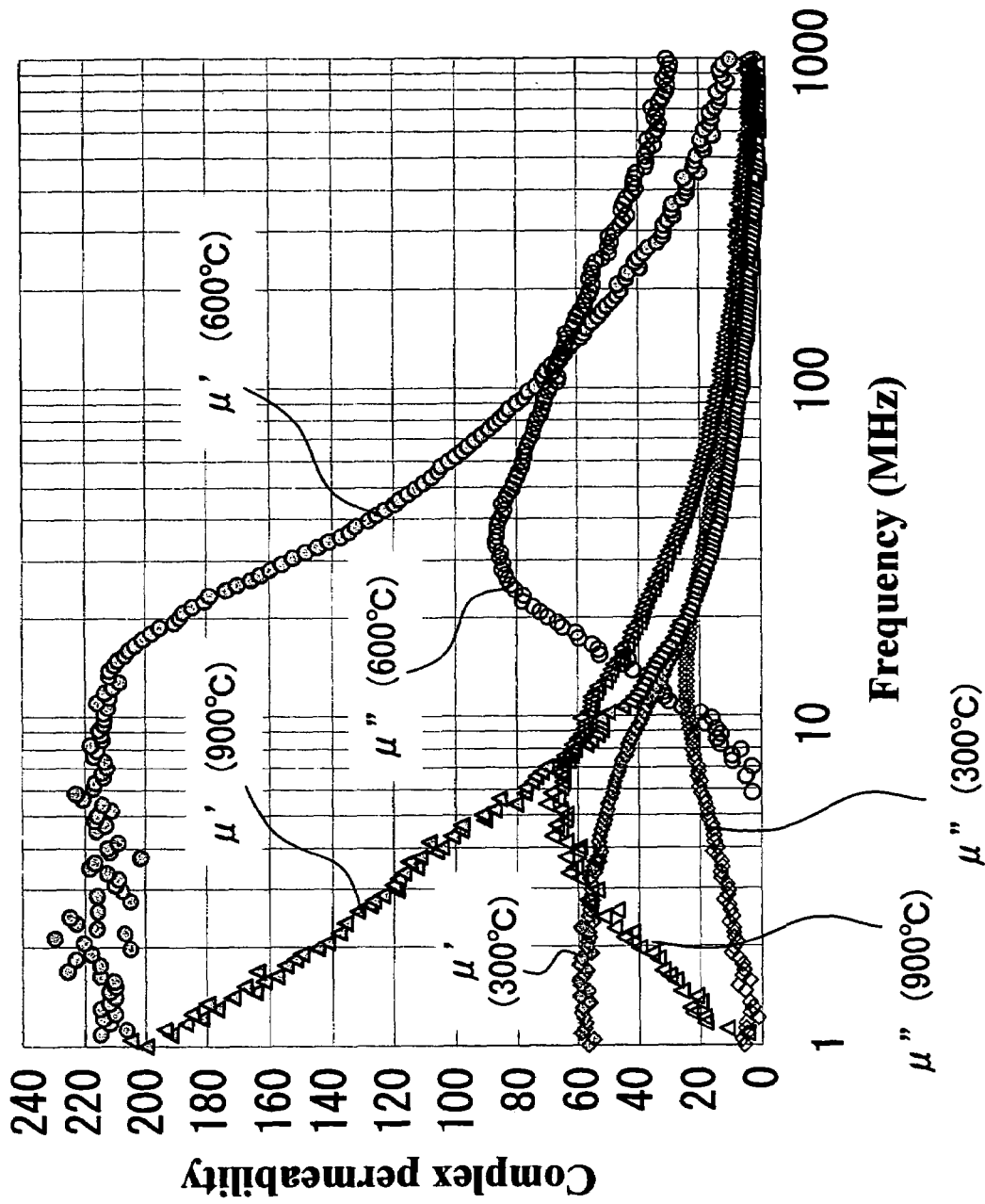
FIG. 8 is a graph showing, for varied heat treatment temperatures, the frequency dependence of the complex permeability of a 20 µm thick sample involved in Example 2 of the present invention in which 4 wt % of a perhydropolysilazane solution was used.

As shown in FIG. 8, the sample (the sample No. 3) subjected to the heat treatment at 600° C. exhibits satisfactory properties, but the case (Comparative Example No. 3) subjected to the heat treatment at 900° C. exhibits remarkably deteriorated frequency properties because the insulation function was lost. Additionally, the case (Comparative Example No. 2) subjected to the heat treatment at 300° C. reveals that the temperature was too low, so that the residual strain in the flaky powder caused by the rolling orientation treatment into sheet-like shape was not sufficiently relieved. Thus, it can be concluded that a suitable range exits for the heat treatment.

As a result of a more detailed investigation, although somewhat varying depending on the concentration and quality of the insulating material, the heat treatment temperature range from 400 to 800° C., particularly preferably from 550 to 700° C., was confirmed to be effective.

As can be seen from FIG. 8, the sample No. 3 (the heat treatment temperature: 600° C.) was found to have a $\mu'$ value of 70 and a $\mu''$ value of 68, both being satisfactory. On the other hand, Comparative Example 2 (the heat treatment temperature: 300° C.), which is the same as the sample No. 3 in the loading of the insulating material, was found to have a $\mu'$ value of 7 and a $\mu''$ value of 9; Comparative Example 3 (the heat treatment temperature: 900° C.) was found to have a $\mu'$ value of 7 and a $\mu''$ value of 12; thus both Comparative Examples exhibited the complex magnetic permeabilities of the order of ⅕ that of the sample No. 3.

From the above described results, it can be said that the setting of the heat treatment temperature at 400 to 800° C. can improve the magnetic properties of the magnetic layer 10.

Example 3

A water atomized 2Mo Permalloy powder (80Ni-2Mo-bal.Fe (mol %)) of 30 μm in mean particle size, as the soft magnetic metal powder, was used, and was transformed, in a manner similar to that in the above described Example 1, into a flaky powder of 50 μm in mean particle size, 0.1 to 0.8 μm in particle thickness, and 10 to 150 in aspect ratio. Additionally, the flaky soft magnetic metal powder and perhydropolysilazane were subjected to the insulation treatment by means of a procedure similar to that in Example 1.

Then, for the purpose of depositing the insulated flaky soft magnetic metal powder (magnetic powder 11) uniformly on a stainless steel substrate, the magnetic powder 11 was dispersed in toluene and the dispersion solution was transferred into a spray vessel, and the spraying was conducted from a position 300 mm above the substrate so as for the deposition thickness to be nearly uniform, thus the magnetic powder 11 being deposited on the substrate. Evaporation of the toluene dried the magnetic powder 11 deposited on the substrate, and thereafter, the substrate was subject to the rolling orientation step by being passed between two-stage cold rolling rolls 50 mm in diameter, to produce an about 15 µm thick sheet-like product forming the magnetic layer 10. It should be noted that the loading of the solution of 20 wt % perhydropolysilazane in xylene was set to be 4 wt % in relation to the flaky powder. The sheet-like product was subjected to the heat treatment in the atmosphere of nitrogen at 600° C. for 60 minutes, then blanked into a toroidal shape to prepare a sample and the sample was subject to the evaluation of the frequency dependence of the complex permeability (real part: µ'; imaginary part: µ") The results obtained are shown in FIG. 10.

Figure 10:
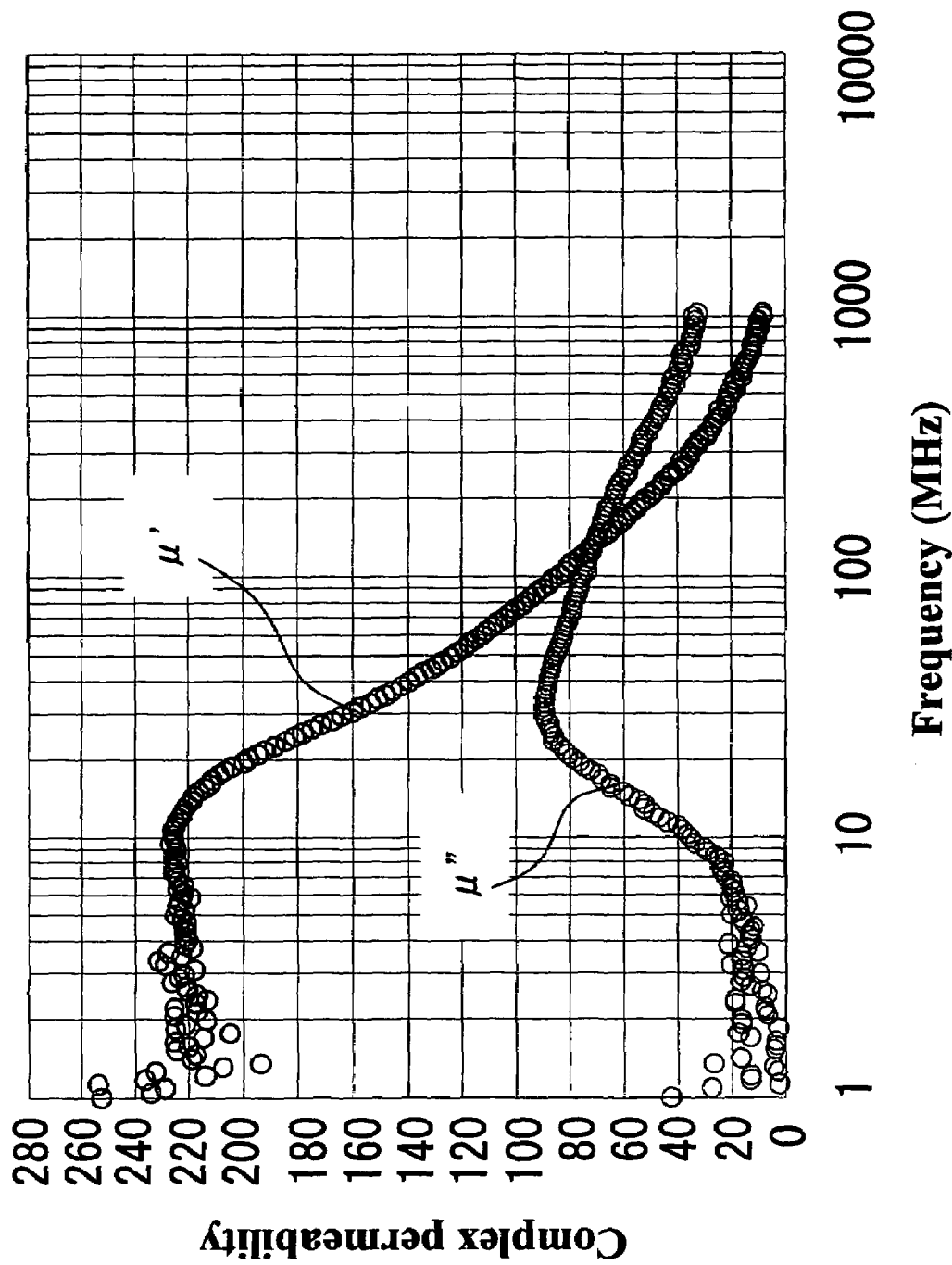
FIG. 10 is a graph showing the frequency dependence of the complex permeability of a 15 µm thick sample involved in Example 3 of the present invention.

As shown in FIG. 10, the sample in which the magnetic powder 11 was deposited by spraying exhibits satisfactory properties similarly to the sample of Example 1 (the sample No. 1) in which the magnetic powder 11 was deposited by using a sieve.

Example 4

A flaky 4Mo Permalloy powder of 40 µm in mean particle size similar to that in Example 1 was used, and the insulating material was replaced with a silane coupling agent or a titanate coupling agent, the cold rolling was conducted in a manner similar to that in Example 1 to yield an about 25 µm thick sheet-like product, and the product was blanked into a toroidal shape. Thereafter, the heat treatment was applied and the samples (the samples Nos. 4 and 5) thus obtained were subjected to the complex permeability measurement at 100 MHz. The obtained results are shown in FIG. 11 together with the blending ratios and the heat treatment conditions. The insulation treatment with the coupling agents was conducted on the basis of the wet method well known in the art.

As can be seen from FIG. 11, the samples Nos. 4 and 5 each are found to have a µ' value of 30 or more and a µ" value of 40 or more, both samples exhibiting satisfactory values. Consequently, it has been found that the silane based coupling agent and the titanate based coupling agent can be suitably used as the insulating materials.

Example 5

The same flaky 4Mo Permalloy powder as that in Example 1 was used, the insulation treatment was conducted with perhydropolysilazane, mixing with silica sol was conducted, and the cold rolling was conducted in a manner similar to that in Example 1 to yield an about 25 µm thick sheet-like product. The sheet-like product was blanked, and thereafter, the heat treated sample (sample No. 6) was subjected to the complex permeability measurement at 100 MHz. The obtained results are shown in FIG. 12 together with the blending ratio and the heat treatment conditions.

As can be seen from FIG. 12, the sample No. 6 exhibits remarkably excellent complex permeability (real part: µ';  imaginary part: µ") contrast to Comparative Examples 4 and 5 which are conventional resin composite sheets. Consequently, it has been confirmed that the method comprises the insulation treatment with perhydropolysilazane and the additional mixing with silica sol thereafter is also effective.

Example 6

A flaky 4Mo Permalloy powder of 40 µm in mean particle size prepared in a manner similar to that in Example 1 was used, and the flaky 4Mo Permalloy powder, and boron nitride (BN) and a silica sol, both as the insulating materials, were mixed together; then, the insulation treatment was conducted, and thereafter, the rolling orientation treatment was conducted by passing the substrate between the cold rolling rolls in a manner similar to that in Example 1 to yield an about 30 µm thick sheet-like product. The sheet-like product was blanked into a toroidal shape, and thereafter, the blanked product was subjected to the heat treatment in the atmosphere of nitrogen at 650° C. for 60 minutes to yield a sample; the obtained sample (the sample No. 7) was subjected to the complex permeability (real part: µ'; imaginary part: µ') evaluation. The obtained results are shown in FIG. 13 together with the blending ratio.

A comparison between the magnetic properties of the sample No. 7 and those of Comparative Example 1 produced in Example 1 reveals that the sample No. 7 exhibits permeability higher by a factor of about 3. However, a comparison of the magnetic properties of the sample No. 7 and those of the sample No. 1 produced in Example 1 reveals that the sample No. 1 exhibits a more satisfactory complex permeability.

From the above results, it has been found that perhydropolysilazane is suitable as the insulating material.

Example 7

A water atomized 2Mo Permalloy powder of 30 µm in mean particle size was used as the soft magnetic metal powder, and was transformed in a manner similar to that in Example 1 into a flaky powder of 130 µm in mean particle size, 0.1 to 0.8 µm in thickness and 10 to 150 in aspect ratio. Additionally, a solution of 20 wt % perhydropolysilazane in xylene was added in 4 wt % in relation to the flaky powder, and then the insulation treatment was conducted.

Then, the flaky powder (magnetic powder 11) subjected to the insulation treatment was classified by use of the sieves different in mesh size and the following 9 classified powders were obtained. These classified powders were subjected to the rolling orientation treatment by passing them between the cold rolling rolls, to produce an about 20 µm thick sheet-like product. The sheet-like product was blanked into a toroidal shape, and the blanked product was heat treated in the atmosphere of nitrogen at 500° C. for 60 minutes and thereafter subjected to the complex permeability (real part: µ'; imaginary part: µ") measurement. The results obtained are shown in FIG. 14.

The classified powders (µm):20 to 32, 32 to 38, 38 to 45, 45 to 53, 53 to 63, 63 to 75, 75 to 90, 90 to 106, 106 under.

Figure 14:
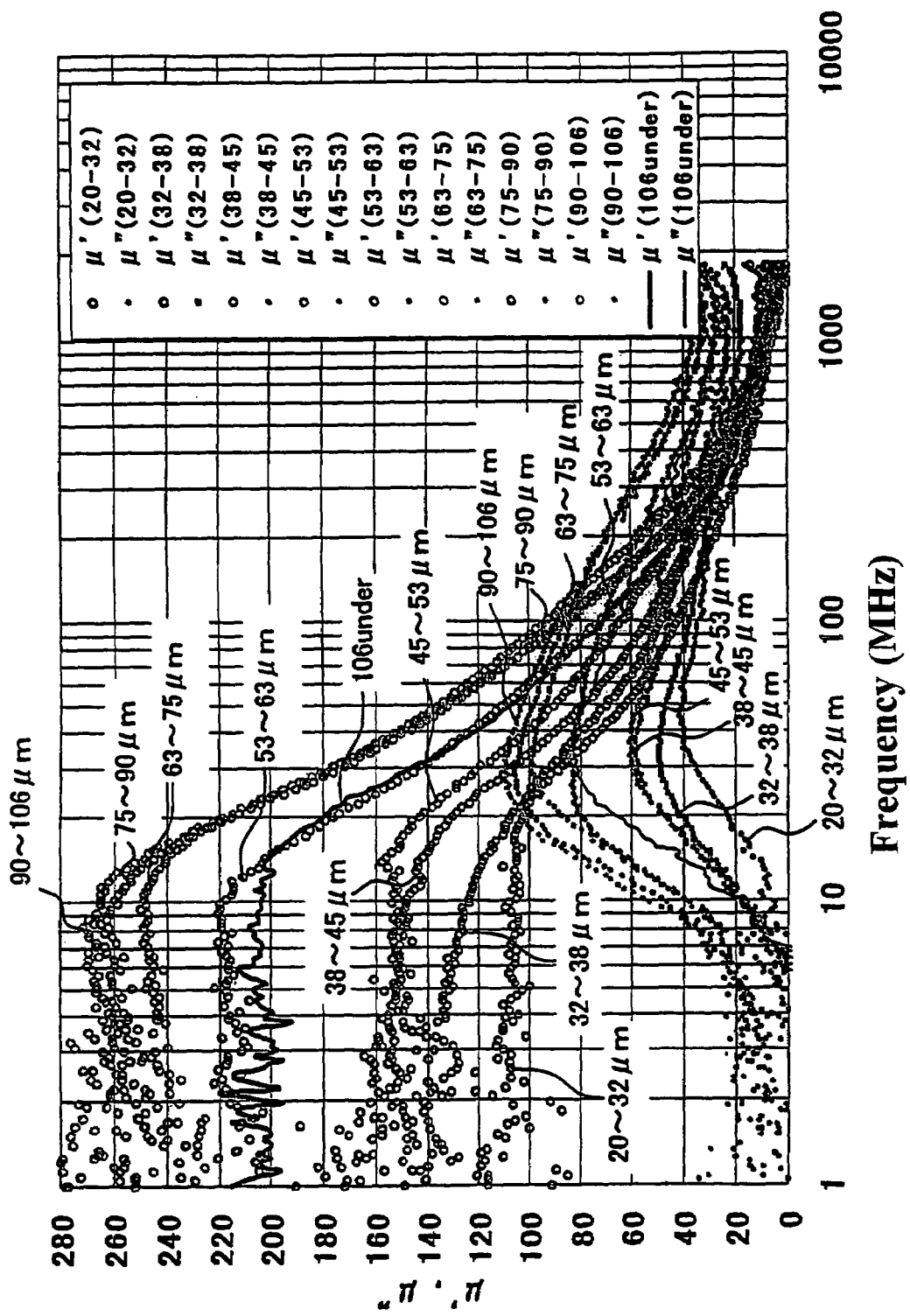
FIG. 14 is a graph showing the frequency dependences of the complex permeabilities of the samples manufactured with 9 different types of classified powders, involved in Example 7 of the present invention.

As shown in FIG. 14, the magnetic properties are varied with the classified sizes, namely, the particle size of the flaky powders. For example, when the 20 to 45 µm classified powder was used, the µ' value at 100 MHz can be made to be of the order of 30 to 60. Additionally, when the 45 to 106 µm classified powders were used, the µ' value at 100 MHz can be made to be 60 or more. Particularly, it attracts the attention that when the 63 to 106 µm classified powder was used, the µ' value at 100 MHz comes to be 80 or more.

Additionally, when the 45 to 106 µm classified powders were used, it was confirmed that the µ" value at 100 MHz also comes to exhibit an satisfactory value of 60 or more.

From the above results, it has been found that by making the particle size of the flaky powder be of the order of 40 to 120 µm, a magnetic sheet (composite magnetic material) excellent in magnetic properties can be obtained.

Example 8

A water atomized 2Mo Permalloy powder of 30 µm in mean particle size was used as the soft magnetic metal powder, and was transformed in a manner similar to that in Example 1 into a flaky powder of 130 µm in mean particle size, 0.1 to 0.8 µm in thickness and 10 to 150 in aspect ratio.

Additionally, a solution of 20 wt % perhydropolysilazane in xylene was added in 4 wt % in relation to the flaky powder to carry out the insulation treatment.

Figure 15:
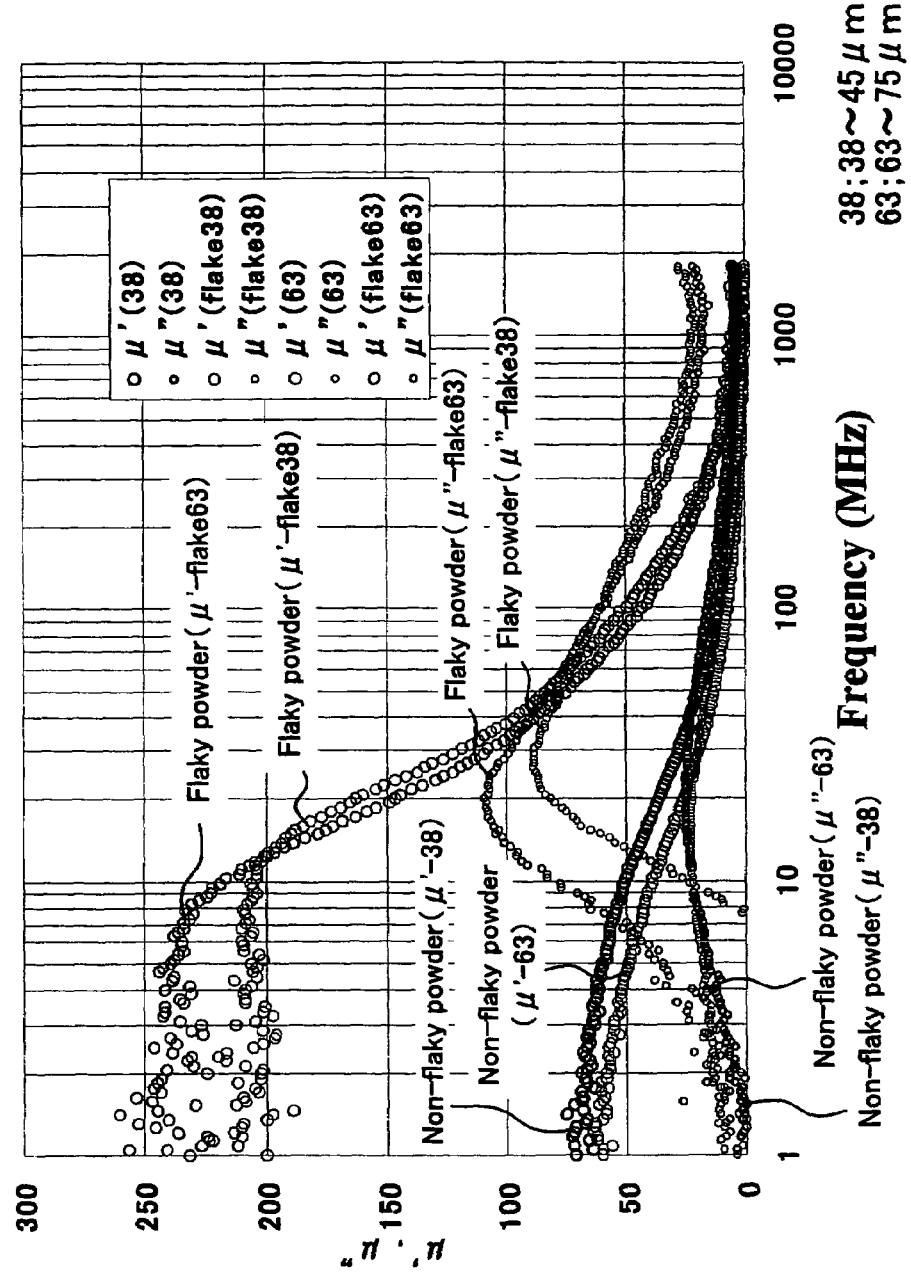
FIG. 15 is a graph showing the frequency dependences of the complex permeabilities of the samples in which flaky powders were used, involved in Example 8 of the present invention, in comparison with the cases in which non-flaky powders were used.

Then, the insulation treated flaky powder (magnetic powder 11) was classified by use of the sieves with mesh sizes of 38 µm and 63 µm. These classified powders were subjected to the rolling orientation treatment by passing them between the cold rolling rolls, to produce about 20 µm thick sheet-like products. The sheet-like products were blanked into toroidal shapes, and the blanked products were heat treated in the atmosphere of nitrogen at 500° C. for 60 minutes and thereafter subjected to the complex permeability (real part: µ'; imaginary part: µ") measurement. Additionally, by means of the same steps as described above except that a water atomized 2Mo Permalloy powder of 50 µm in mean particle size was used as it was as the soft magnetic metal powder, an about 20 µm thick sheet-like product was obtained as a comparative example, and was likewise subjected to the complex permeability (real part: µ'; imaginary part: µ") measurement. The results obtained are shown in FIG. 15. An observation of the sheet-like product of the comparative example confirmed that even after the rolling, the irregular shape condition of the powder caused by the water atomization was maintained.

As shown in FIG. 15, the cases where the flaky powders were used exhibit at 1 to 10 MHz the µ' values 4 to 5 times those of the cases where the non-flaky powders were used. At 100 MHz, the µ' values of the case where the non-flaky powders were used are around 20, while the µ' values of the cases where the flaky powders were used are 40 or more.

It has been confirmed that the rises and peak values of µ" shit to the higher frequencies for the cases where the flaky powders were used than for the cases where the non-flaky powders were used.

From the above results, it has been found that the use of a flaky powder permits obtaining a magnetic sheet (composite magnetic material) drastically improved in magnetic properties.

Example 9

A water atomized 2Mo Permalloy powder of 30 µm in mean particle size was used as the soft magnetic metal powder, and was transformed in a manner similar to that in Example 1 into a flaky powder of 130 µm in mean particle size, 0.1 to 0.8 µm in thickness and 10 to 150 in aspect ratio. Additionally, a solution of 20 wt % perhydropolysilazane in xylene was added in 4 wt % in relation to the flaky powder to carry out the insulation treatment.

Then, the above described insulation treated flaky powder (magnetic powder 11) was deposited nearly uniformly on a stainless steel substrate while sieving using a sieve (mesh size: 106 µm or less) 10 mm above the stainless steel substrate. The stainless steel substrate was subjected to rolling by being passed between a two stage of cold rolling rolls of 50 mm in roll diameter, and thus each flaky powder was oriented parallel to the substrate, yielding an about 20 µm thick sheet-like product. The sheet-like product was blanked into a toroidal shape, and the blanked product was heat treated in the atmosphere of nitrogen at 500° C. for 60 minutes.

Subsequently, 10 types of resin solutions were prepared by adjusting the respective amounts of 10 types of thermoplastic resins (the resins A to J) with toluene so as for the concentrations to be 5 wt %. By using these resin solutions, the resin coating treatment was applied to the sheet-like composite magnetic material (the sheet-like composite magnetic material was soaked in the resin solutions for 15 minutes, and then dried at room temperature). The results of the strength test conducted thereafter are shown in FIG. 16.

Figure 16:
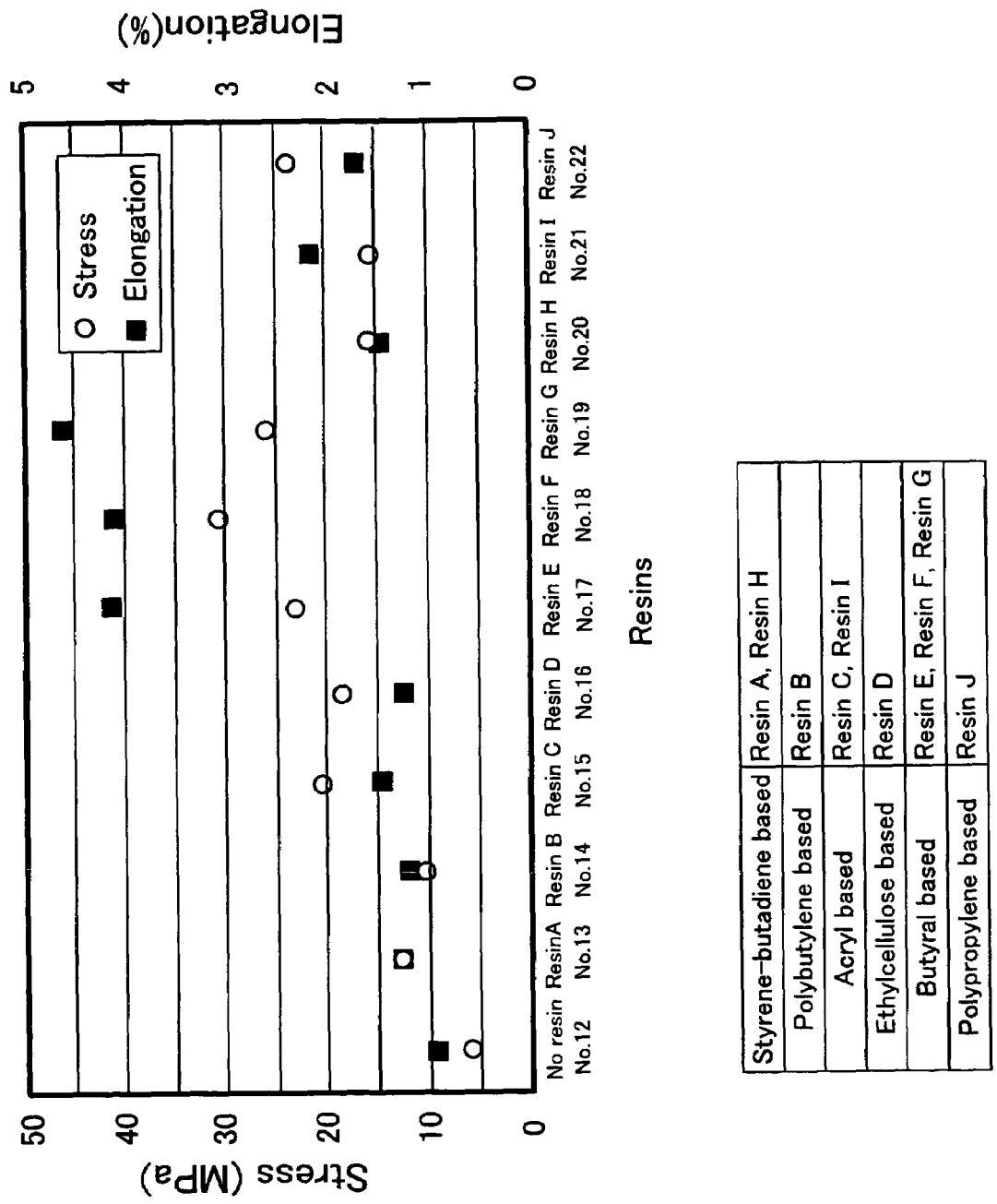
FIG. 16 is a graph showing the results of the strength test for the sheet-like samples subjected to the resin coating treatment, involved in Example 9 of the present invention.

As shown in FIG. 16, the resin coated samples Nos. 13 to 22 are superior in the values of both stress and elongation to the sample No. 12 not subjected to resin coating. In particular, the samples Nos. 15, 17 to 19, and 21 soaked in the butyral based resins and acryl based resins exhibit the stress values 2.5 to 5 times that of the sample No. 12, and the elongation values 1.5 to 4.5 times that of the sample No. 12.

From the above results, it has been found that the application of the resin coating treatment to the magnetic sheet (composite magnetic material) can improve the strength of the magnetic sheet. Additionally, it has been confirmed that the resin coated on the sheet bonds the particles of the magnetic powder 11 constituting the magnetic sheet (composite magnetic material) to each other.

Additionally, a comparison between the magnetic properties of the sample No. 12 and those of the samples Nos. 13 to 22 revealed that any of these magnetic properties are comparable with each other, so that it can be said that even when the composite magnetic material 1 is subjected to the resin coating treatment, the magnetic properties thereof is not altered.

Measurement of the thickness values of the samples Nos. 13 to 22 revealed that some of these samples exhibited the same thickness as that of the sample No. 12. In other words, it is suggested that voids were present in the interior of the magnetic sheet (composite magnetic material), so that the resin soaked into these voids.

Example 10

Similarly to Example 1, a 4Mo Permalloy powder of 20 µm in mean particle size was pulverized in a medium stirring mill using toluene as solvent, and thereby transformed into a flaky soft magnetic metal powder of 40 µm in mean particle size, 0.2 to 0.6 µm in particle thickness, and 30 to 120 in aspect ratio. As the insulating material, perhydropolysilazane (Tonen polysilazane L110, 20 wt % xylene solution) was used. The loading of the perhydropolysilazane solution was set at 4 wt % in relation to the flaky Permalloy powder. The flaky soft magnetic metal powder and perhydropolysilazane were mixed together by means of a mixing apparatus at room temperature for 30 minutes. Then, the mixture was maintained at 300° C. for 60 minutes in the air, and thus perhydropolysilazane was transformed into $SiO_2$ to form the insulating film on the surface of the flaky Mo Permalloy powder.

Then, the insulation treated flaky powder (magnetic powder 11) was deposited nearly uniformly on a stainless steel substrate while sieving using a sieve (mesh size: 125 µm or less) 10 mm above the stainless steel substrate. Then the stainless steel substrate was subjected to rolling by being passed between a two stage of cold rolling rolls of 50 mm in roll diameter, and thus each flaky powder was oriented parallel to the substrate, yielding an about 20 µm thick sheet-like shape.

The sheet was heat treated at 600° C. for 1 hour in the atmosphere of nitrogen, and thereafter, for the purpose of reinforcing of and imparting insulating property to the sheet, an epoxy based adhesive was applied onto both sides of the sheet and then a 2 µm thick PET film was adhered.

The sheet thus treated was blanked into a toroidal shape, and was subjected to the measurement of the frequency dependence of the complex permeability by means of the one turn method.

Figure 17:
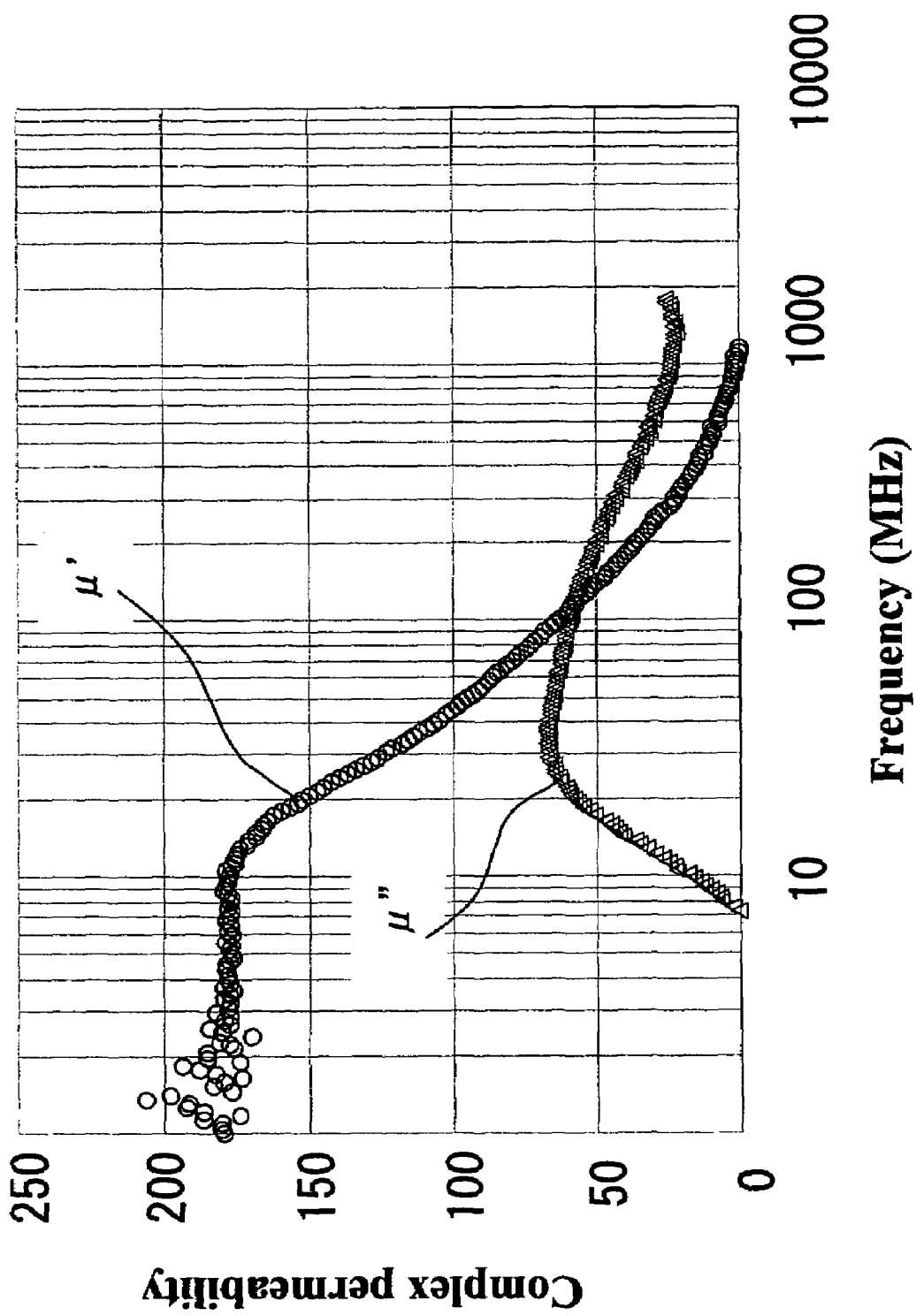
FIG. 17 is a graph showing the frequency dependence of the complex permeability of an electromagnetic wave absorbing sheet subjected to the resin coating treatment, involved in Example 10 of the present invention.

The results thus obtained were shown in FIG. 17. As shown in FIG. 17, this case also exhibits a satisfactory frequency dependence.

Example 11

Similarly to Example 1, a 4Mo Permalloy powder of 20 µm in mean particle size was pulverized in a medium stirring mill using toluene as solvent, and thereby transformed into a flaky soft magnetic metal powder of 40 µm in mean particle size, 0.2 to 0.6 µm in particle thickness, and 30 to 120 in aspect ratio. As the insulating material, perhydropolysilazane (Tonen polysilazane L110, 20 wt % xylene solution) was used. The loading of the perhydropolysilazane solution was set at 4 wt % in relation to the flaky Permalloy powder. The flaky soft magnetic metal powder and perhydropolysilazane were mixed together by means of a mixing apparatus at room temperature for 30 minutes. Then, the mixture was maintained at 300° C. for 60 minutes in the air, and thus perhydropolysilazane was transformed into $SiO_2$ to form the insulating film on the surface of the flaky Mo Permalloy powder.

Then, the insulation treated flaky powder (magnetic powder 11) was deposited nearly uniformly on a stainless steel substrate while sieving using a sieve (mesh size: 125 µm or less) 10 mm above the stainless steel substrate. Then the stainless steel substrate was subjected to rolling by being passed between a two stage of cold rolling rolls of 50 mm in roll diameter, and thus each flaky powder was oriented parallel to the substrate, yielding an about 20 µm thick sheet-like shape.

The sheet was subjected to the heat treatment at 600° C. for 1 hour in the atmosphere of nitrogen. Thereafter, for the purpose of imparting flexibility and insulating property to the sheet, a 2 µm thick PET film was arranged on both front and back sides of the sheet, and additionally the sheet was subjected to thermo-compression bonding under the conditions of 220° C. and 10 MPa for two minutes.

The sheet thus treated was blanked into a toroidal shape, and was subjected to the measurement of the frequency dependence of the complex permeability (real part: µ'; imaginary part: µ") by means of the one turn method. Consequently, it was found that a magnetic sheet (composite magnetic material) having µ'=150 and µ"=26 (at 1 MHz), and µ=55 and µ=45 (at 100 MHz) can be obtained. Additionally, this sheet did not suffer from the fracture and crack generation even when bent to 90 degrees.

Example 12

Similarly to Example 1, a 4Mo Permalloy powder of 20 µm in mean particle size was pulverized in a medium stirring mill using toluene as solvent, and thereby transformed into a flaky soft magnetic metal powder of 40 µm in mean particle size, 0.2 to 0.6 µm in particle thickness, and 30 to 120 in aspect ratio. As the insulating material, perhydropolysilazane (Tonen polysilazane L110, 20 wt % xylene solution) was used. The loading of the perhydropolysilazane solution was set at 4 wt % in relation to the flaky Permalloy powder. The flaky soft magnetic metal powder and perhydropolysilazane were mixed together by means of a mixing apparatus at room temperature for 30 minutes. Then, the mixture was maintained at 300° C. for 60 minutes in the air, and thus perhydropolysilazane was transformed into $SiO_2$ to form the insulating film on the surface of the flaky Mo Permalloy powder.

Then, the insulation treated flaky powder (magnetic powder 11) was deposited nearly uniformly on a stainless steel substrate while sieving using a sieve (mesh size: 125 µm or less) 10 mm above the stainless steel substrate. Then the stainless steel substrate was subjected to rolling by being passed between a two stage of cold rolling rolls of 50 mm in roll diameter, and thus each flaky powder was oriented parallel to the substrate, yielding an about 20 µm thick sheet-like shape.

The sheet was heat treated at 600° C. for 1 hour in the atmosphere of nitrogen. Thereafter, for the purpose of imparting strength, insulating property and flame resistance to the sheet, the sheet was soaked in a 20% solution of a flexible inorganic coating material (manufactured by Tokiwa Denki Co., Ltd., FJ803) for 10 minutes. After the sheet was taken out from the solution, the solvent was evaporated at room temperature and thus the surface coating was made. Thereafter, the sheet was maintained at 80° C. for 20 minutes in the air to allow the inorganic binder to cure. Then, the strength of the magnetic sheet was comparable with those associated with the butyral based and acryl based resins shown in FIG. 16.

Although the embodiments and examples of the present invention have been described above, it will be self-evident to those skilled in the art that the present invention is not limited thereto but various modifications and changes may be made within the scope of the claims.

INDUSTRIAL APPLICABILITY

As described above in detail, according to the present invention, in the high frequency region, in particular, in the frequency region from several tens MHz to several GHz tending to raise problems in meeting the EMC specifications, higher complex permeability and more excellent electrical insulating property than those of the conventional composite sheets made of magnetic materials and resins. Additionally, the sheet thickness can be made to be 0.1 mm or less, so that the articles as the countermeasures against the EMI can be reduced in size. Additionally, the flaky soft magnetic metal powder needs not be mixed with resins and solvents to prepare a slurry, so that the manufacturing cost can be suppressed and hence an advantage in prices can be provided.

The invention claimed is:

1. A method for manufacturing a magnetic sheet product, comprising the steps of:
   an insulating film formation step for forming an insulating film on the surface of flaky soft magnetic metal powder; and a bonding step for bonding the particles of said magnetic powder to each other by applying a pressing force under a condition such that there is deposited the magnetic powder wherein said insulating film is formed on the surface thereof.

2. A method for manufacturing an electromagnetic wave absorbing sheet, the method comprising the steps of:
- a step for depositing a magnetic powder comprising a flaky soft magnetic metal powder and an insulating film formed on the surface thereof;
- a step for producing a magnetic sheet product by bonding said magnetic powder to each other by applying a pressing force to said deposited magnetic powder; and
- a step for forming an insulating layer made of an electrical insulating material on both surface sides of said magnetic sheet product.

3. A method for manufacturing an electromagnetic wave absorbing sheet according to claim 2, wherein:
in the step for forming said insulating layer, the surface of said magnetic sheet product is covered with a film made of said electrical insulating material.

4. A method for manufacturing an electromagnetic wave absorbing sheet according to claim 2, wherein:
in the step for forming said insulating layer, the surface of said magnetic sheet product is coated with a coating material comprising said electrical insulating material.

5. A method for manufacturing an electromagnetic wave absorbing sheet according to claim 2, wherein:
in the step for producing said magnetic sheet product, said flaky soft magnetic metal powder undergoes plastic deformation by rolling.

6. A method for manufacturing an electromagnetic wave absorbing sheet, wherein the method comprising the steps of:
- an insulation treatment step for obtaining a magnetic powder comprising a flaky soft magnetic metal powder and an insulating film formed on the surface thereof by mixing said flaky soft magnetic metal powder and an insulating material together and thereby insulating said flaky soft magnetic metal powder;
- a rolling orientation step for obtaining a magnetic sheet product by depositing said magnetic powder on a substrate and thereafter orienting said magnetic powder by rolling;
- a heat treatment step for relieving the residual strain in said flaky soft magnetic metal powder constituting said magnetic powder by subjecting said magnetic sheet product to heat treatment; and
- an insulating layer formation step for forming an insulating layer made of an electrical insulating material on the surface of said magnetic sheet product.

7. A method for manufacturing an electromagnetic wave absorbing sheet according to claim 6, wherein a heat treatment for relieving strain is applied to said flaky soft magnetic metal powder prior to said insulation treatment step.

* * * * *